US007501678B2

(12) United States Patent
Arai et al.

(10) Patent No.: US 7,501,678 B2
(45) Date of Patent: Mar. 10, 2009

(54) NONVOLATILE SEMICONDUCTOR MEMORY DEVICE

(75) Inventors: Fumitaka Arai, Yokohama (JP); Masayuki Ichige, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/550,636

(22) Filed: Oct. 18, 2006

(65) Prior Publication Data

US 2007/0120166 A1 May 31, 2007

(30) Foreign Application Priority Data

Oct. 27, 2005 (JP) ............................. 2005-313107

(51) Int. Cl.
*H01L 29/788* (2006.01)
*H01L 29/76* (2006.01)
(52) U.S. Cl. ....................................... 257/316; 257/319
(58) Field of Classification Search .......... 257/314–324
See application file for complete search history.

(56) References Cited

U.S. PATENT DOCUMENTS

| 6,807,096 | B2 * | 10/2004 | Toda ..................... 365/185.03 |
| 6,807,104 | B2 | 10/2004 | Arai et al. |
| 6,859,395 | B2 | 2/2005 | Matsunaga et al. |
| 6,930,921 | B2 | 8/2005 | Matsunaga et al. |
| 7,078,813 | B2 | 7/2006 | Sakuma et al. |
| 2005/0073001 | A1 | 4/2005 | Kamigaichi et al. |
| 2005/0184327 | A1 * | 8/2005 | Ozawa ....................... 257/302 |
| 2006/0018181 | A1 | 1/2006 | Matsunaga et al. |
| 2006/0028855 | A1 | 2/2006 | Matsunaga et al. |
| 2007/0120166 | A1 | 5/2007 | Arai et al. |

FOREIGN PATENT DOCUMENTS

| JP | 10-223867 | 8/1998 |
| JP | 2001-203286 | 7/2001 |
| JP | 2001-223284 | 8/2001 |

OTHER PUBLICATIONS

U.S. Appl. No. 11/447,947, filed Jun. 7, 2006, Makoto Sakuma, et al.
U.S. Appl. No. 11/450,355, filed Jun. 12, 2006, Hiroyuki Kutsukake, et al.
U.S. Appl. No. 11/339,483, filed Jan. 26, 2006, Fumitaka Arai, et al.
U.S. Appl. No. 12/143,597, filed Jun. 20, 2008, Sakuma, et al.

* cited by examiner

*Primary Examiner*—Cuong Q Nguyen
(74) *Attorney, Agent, or Firm*—Oblon, Spivak, McClelland, Maier & Neustadt, P.C.

(57) ABSTRACT

A nonvolatile semiconductor memory device includes a semiconductor substrate. Active regions are formed on the surface of the substrate, separated from one another by element separating regions and extend in a first direction. A first word line and a second word line extend in a second direction crossing the first direction. A pair of first select gate lines extend in the second direction between the first and second word lines. Memory cell transistors are each provided at each of intersections of the first and second word lines and the active regions on the surface of the substrate. First select gate transistors are each provided at each of intersections of the pair of first select gate lines and the active regions on the surface of the substrate. A first contact is provided between the pair of first select gate lines and contacts adjacent two of the active regions.

15 Claims, 37 Drawing Sheets

ATTACHMENT

Reference figure

Reference figure

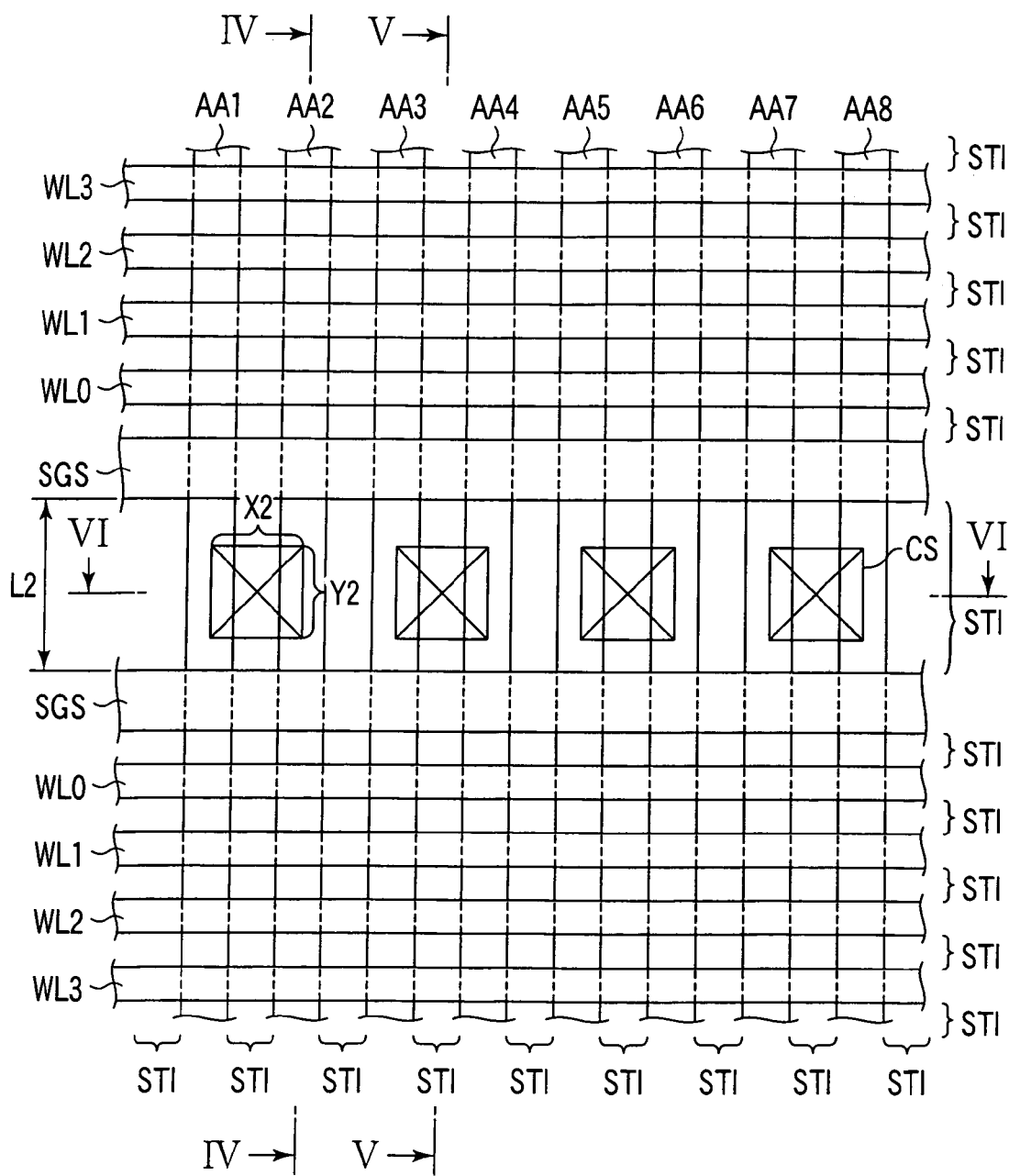
F I G. 10

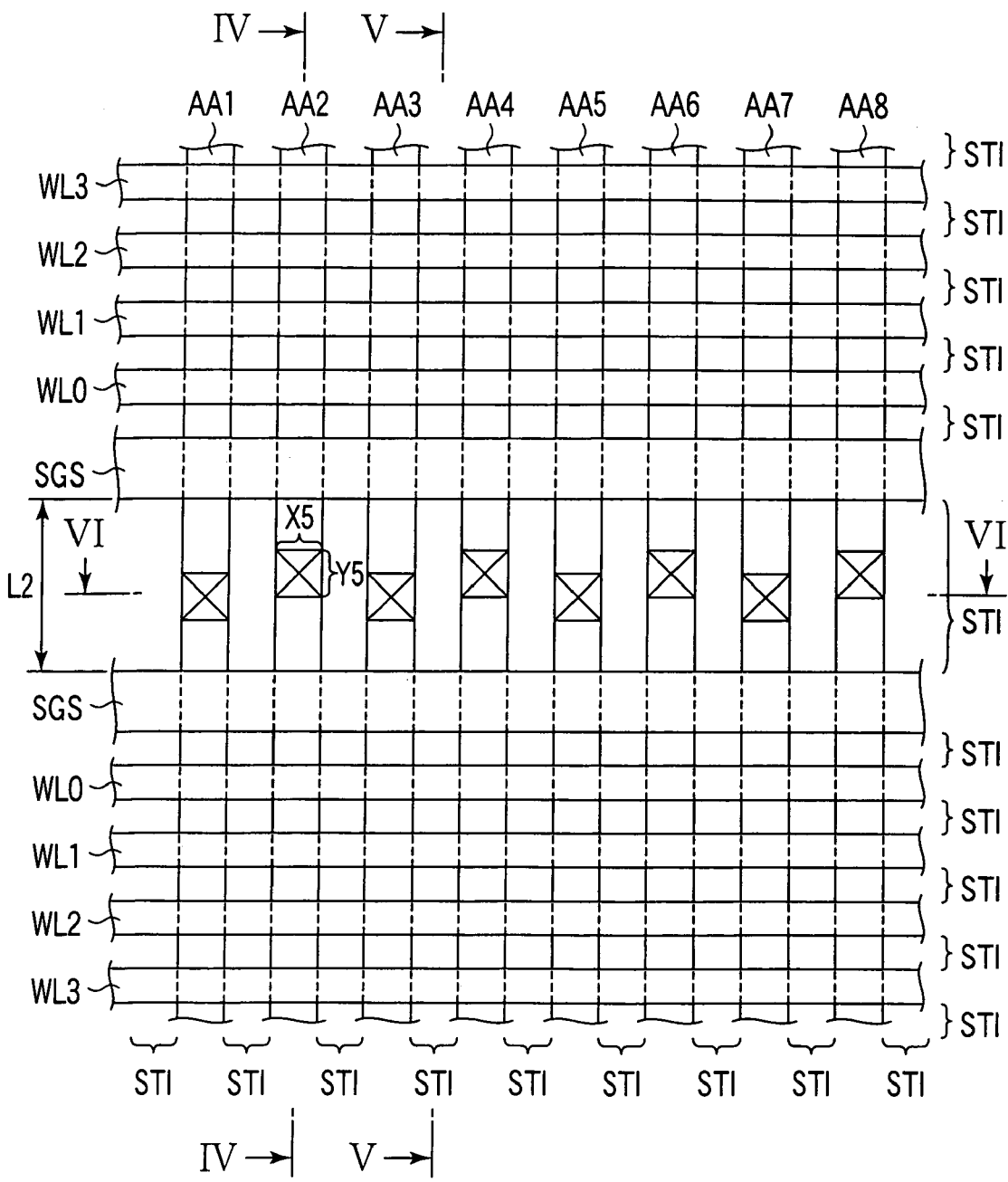
F I G. 22

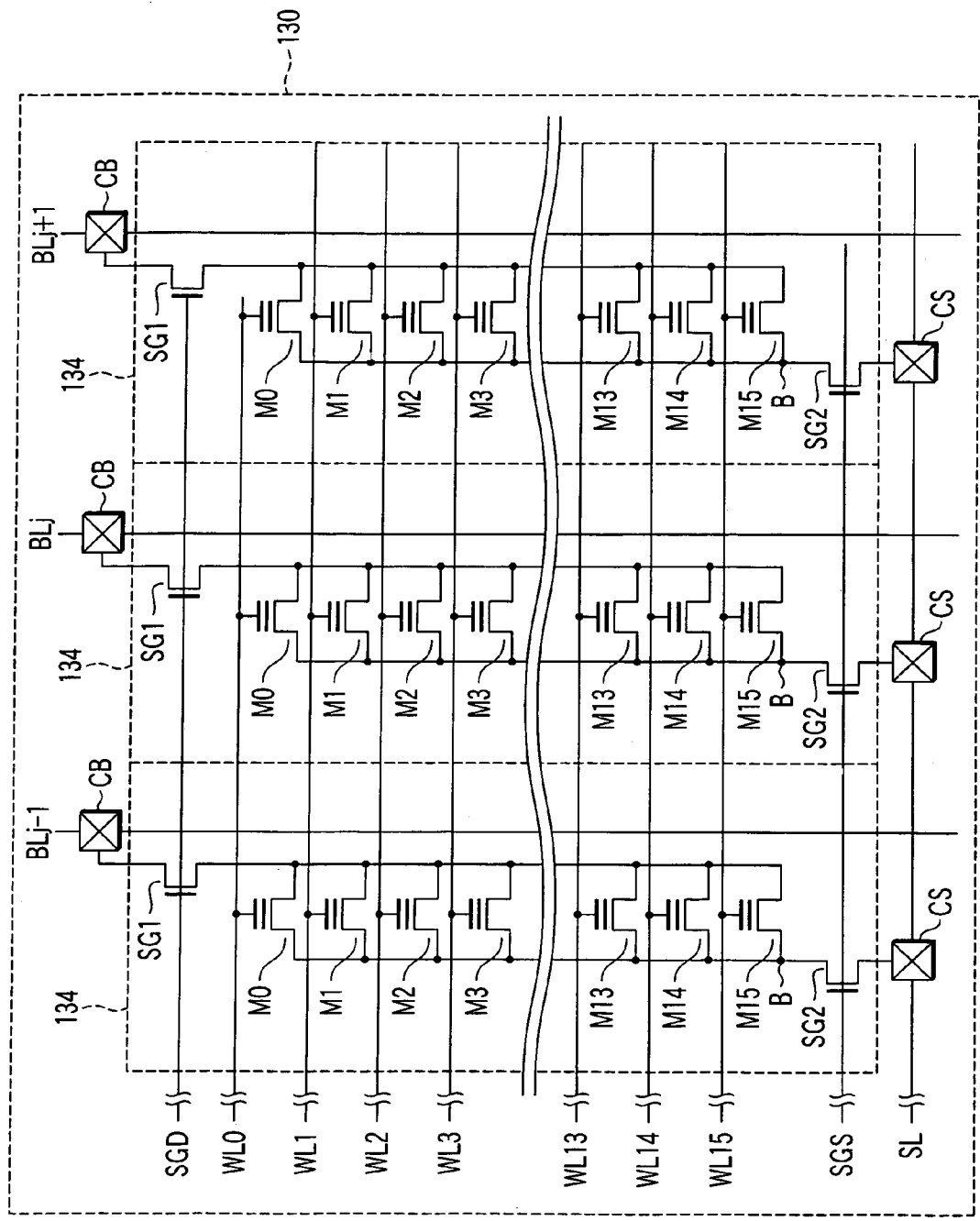
F I G. 31

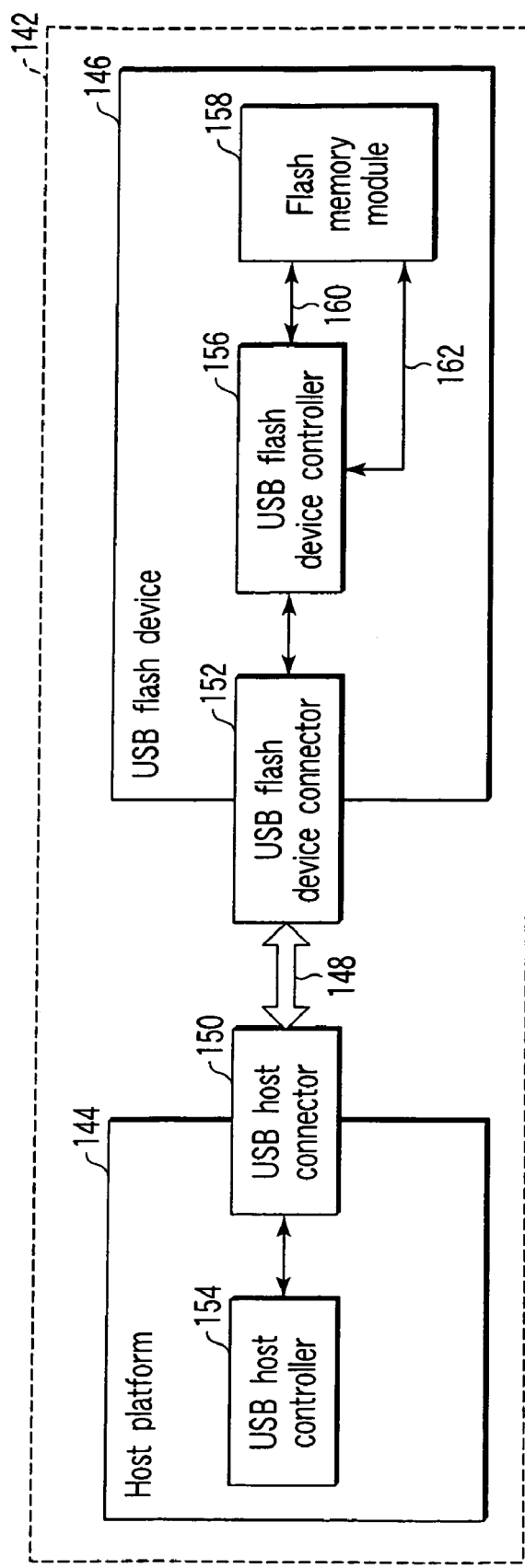
F I G. 35

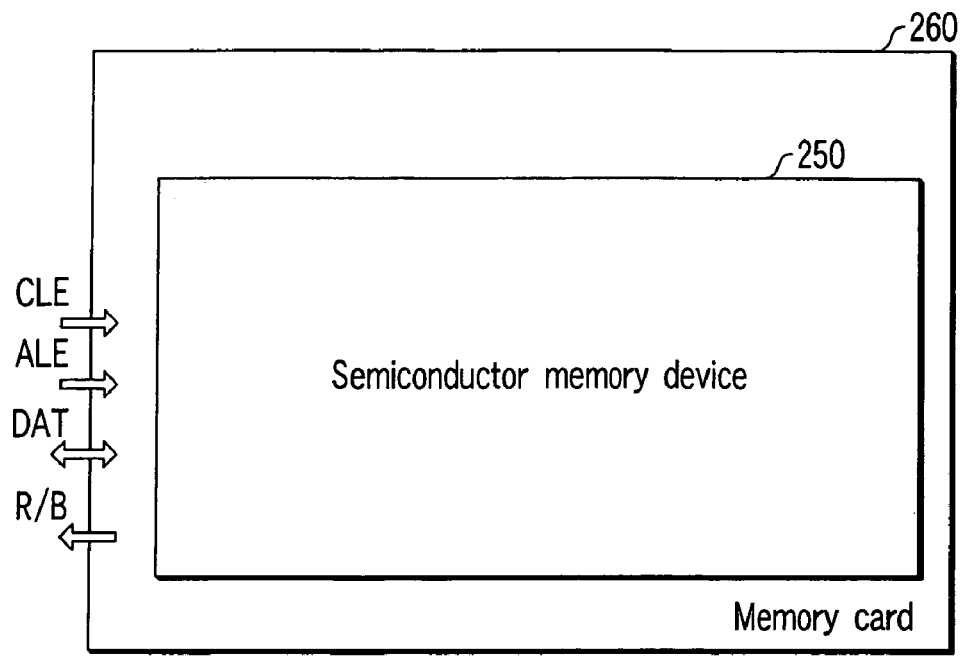
F I G. 36
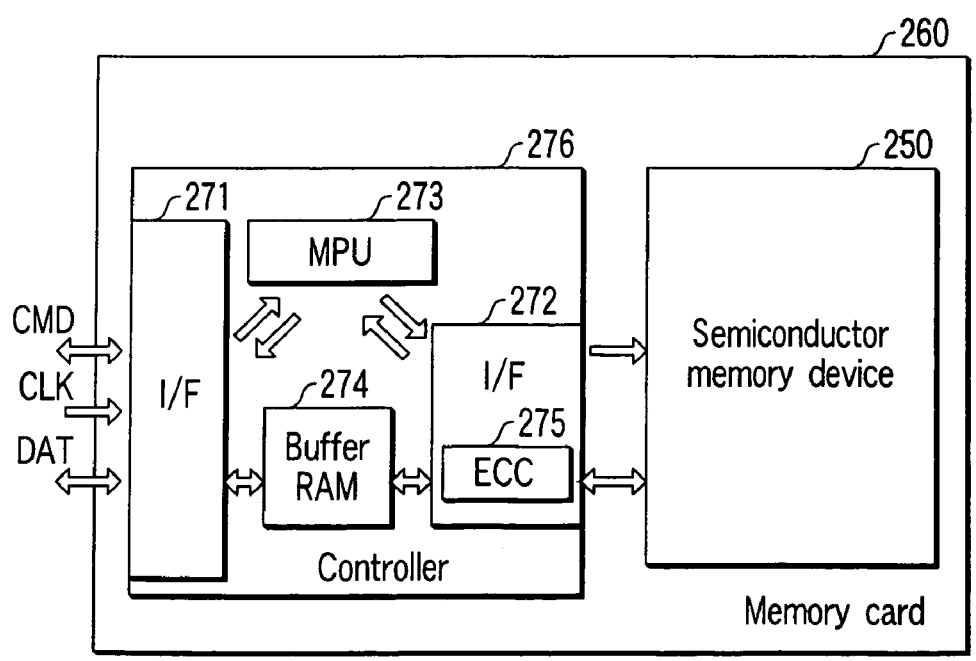
F I G. 37

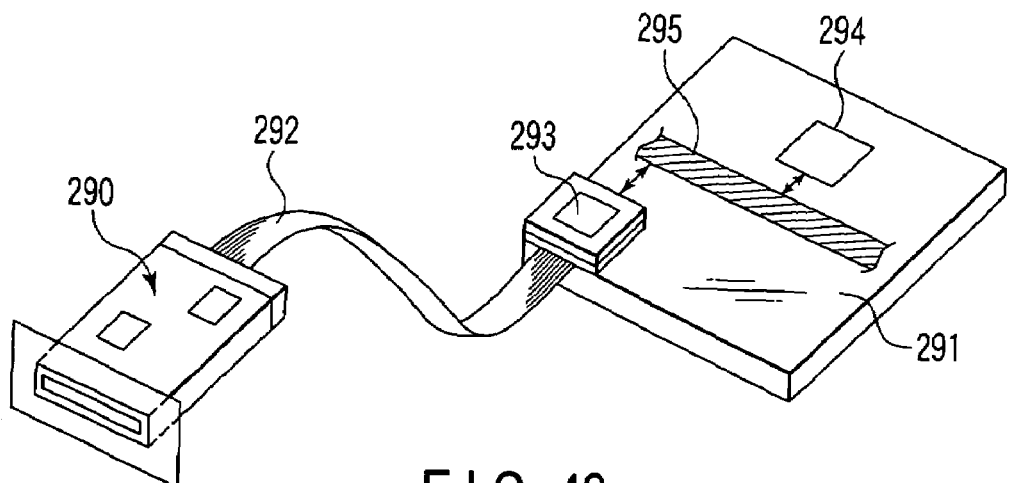
F I G. 42
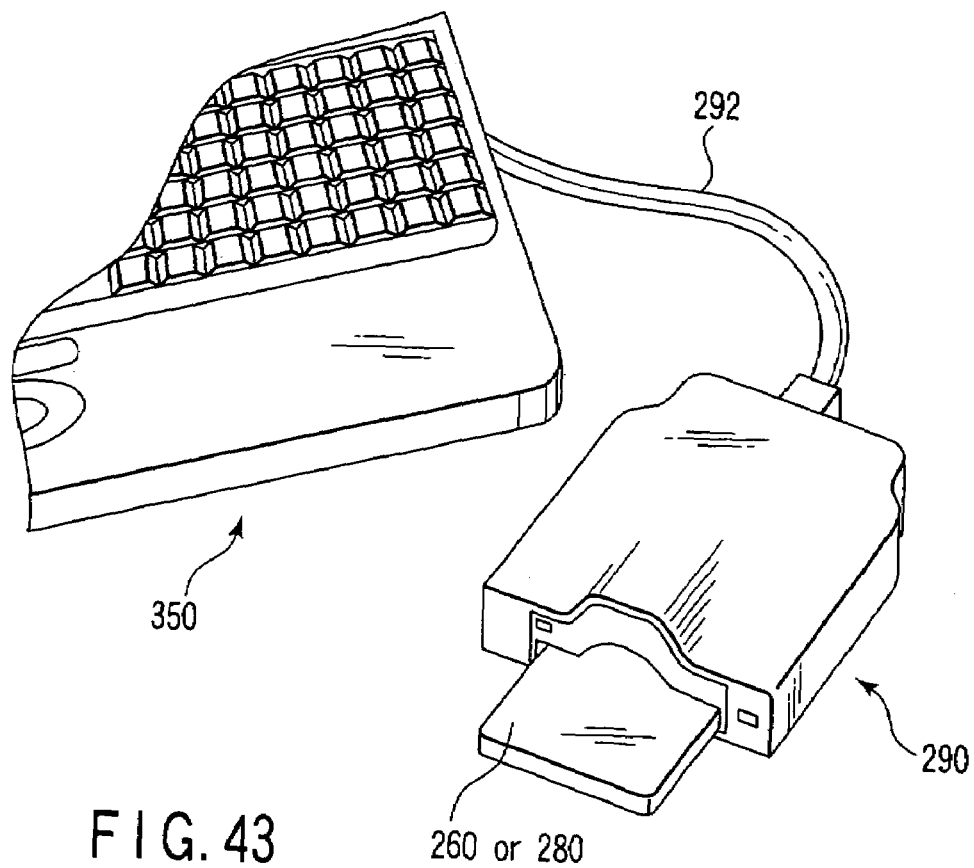
F I G. 43

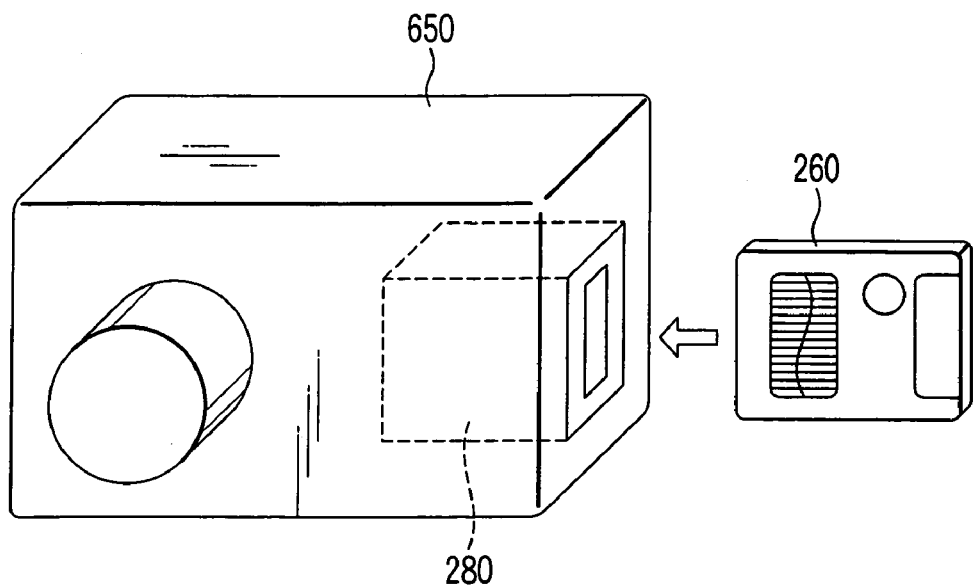
F I G. 44
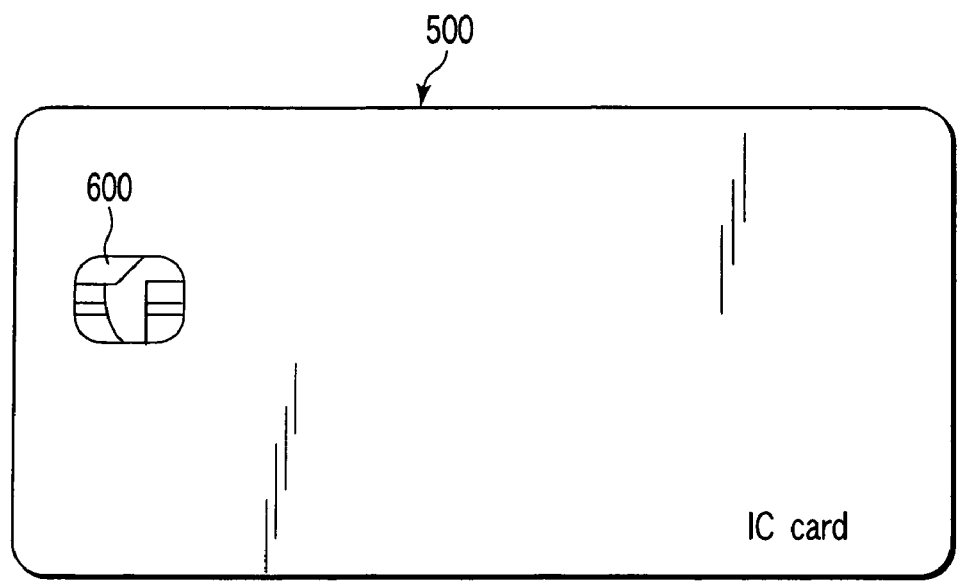
F I G. 45

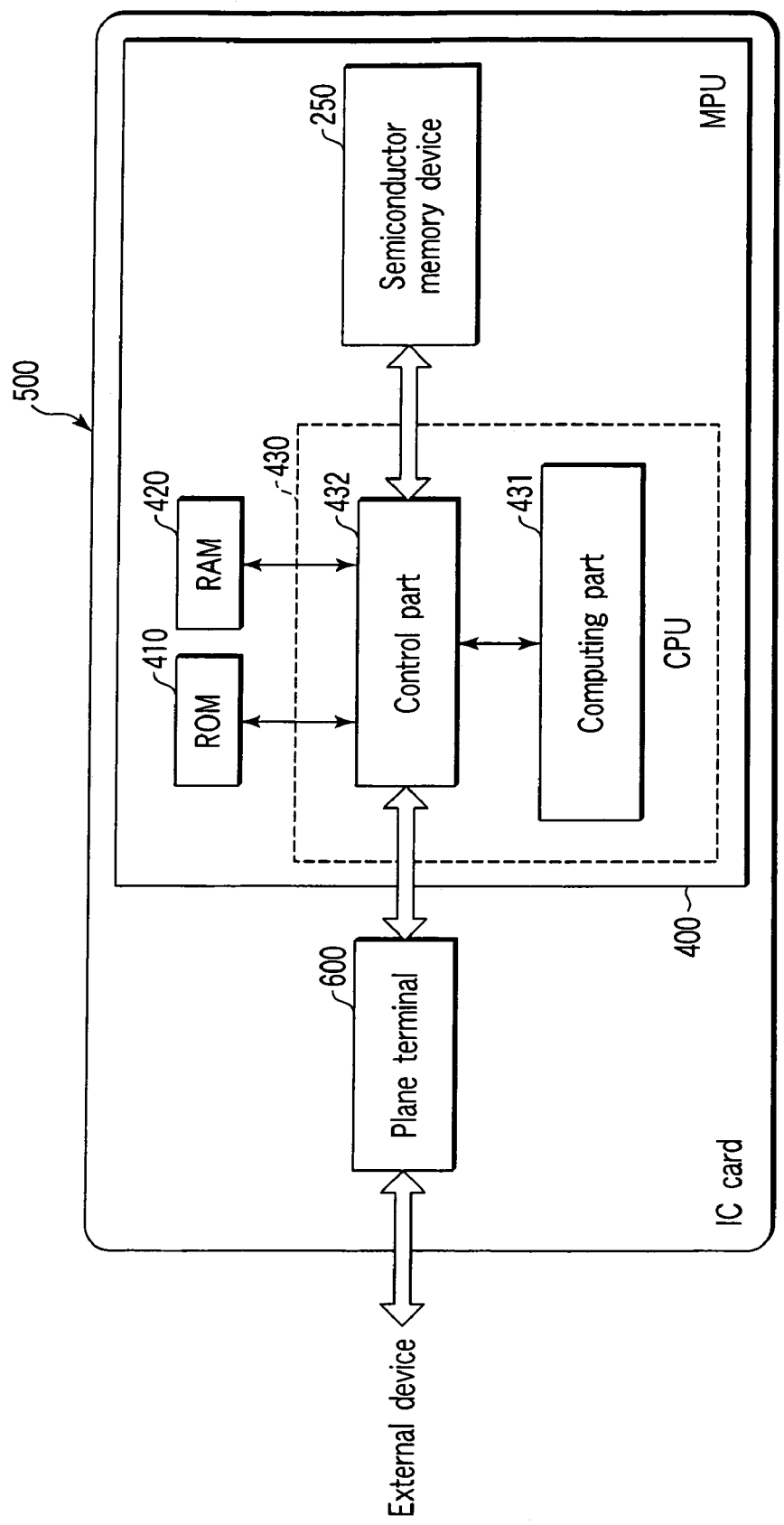
F I G. 46

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2005-313107, filed Oct. 27, 2005, the entire contents of which are incorporated herein by reference.

BACKGROUND OF THE INVENTION

1. Field of the Invention

The present invention relates to a nonvolatile semiconductor memory device, and particularly to the arrangement of a source line contact CS of the nonvolatile semiconductor memory device.

2. Description of the Related Art

A NAND flash electrically erasable programmable read only memory (EEPROM) is known as a nonvolatile semiconductor memory device which is electrically rewritable and allows high integration. Each of the memory cell transistors of the NAND flash EEPROM each has a "stack gate structure" formed on a semiconductor substrate. The structure has a floating gate electrode layer, which is formed on an insulating film formed on a substrate and is provided for charge storing purpose, and a control gate electrode layer. Adjacent memory cell transistors are serially connected in series in the column direction, while having a common source or drain region, and select gate transistors are located at both ends of the serially-connected memory cell transistors, whereby a NAND cell unit is formed.

The NAND cell units are arrayed in a matrix to form a memory cell array. The NAND cell units, which are arrayed in the row, is called a NAND cell block. The gates of the select gate transistors arrayed in the same row are connected to the same select gate line. The control gates of the memory cell transistors arrayed in the same row are connected to the same control gate line.

Contacts for connecting the bit lines and the source lines are formed at both ends of the NAND cell unit in order to feed current to the individual NAND cell units. Two adjacent NAND cell units share one contact to reduce the contact occupying areas. Therefore, the NAND cell units are symmetrical with respect to the bit line contact and the source line contact. The bit line contact and the source line contact are formed between the select gate transistors of the adjacent NAND cell units.

The shorter-side size of the bit line contact between the active region and the bit line is the shortest in the NAND flash EEPROM. Accordingly, the longer-side size of the bit line contact needs to be long. For this reason, the interval between the select gate lines by the bit line contact needs to be wide enough to keep the select gate lines from contacting the bit line contact.

Meanwhile, source line contacts do not need to be insulated from each other unlike the bit line contacts and hence, the space between the select gate lines can be reduced.

A structure of the NAND flash memory in which the source line contacts CS formed on the active regions are alternately shifted in their array is already disclosed (e.g., Jpn. Pat. Appln. KOKAI Publication No. 10-189919).

BRIEF SUMMARY OF THE INVENTION

According to an aspect of the present invention, there is provided a nonvolatile semiconductor memory device comprising: a semiconductor substrate; active regions formed on a surface of the semiconductor substrate, separated from one another by element separating regions and extending in a first direction; a first word line and a second word line both extending in a second direction crossing the first direction; a pair of first select gate lines extending in the second direction between the first word line and the second word line; memory cell transistors each provided at each of intersections of the first and second word lines and the active regions on the surface of the semiconductor substrate; first select gate transistors each provided at each of intersections of the pair of first select gate lines and the active regions on the surface of the semiconductor substrate; and a first contact provided between the pair of first select gate lines and contacting adjacent two of the active regions.

According to an aspect of the present invention, there is provided a nonvolatile semiconductor memory device comprising: a semiconductor substrate; active regions formed on a surface of the semiconductor substrate, separated from one another by element separating regions and extending in a first direction; word lines extending in a second direction crossing the first direction; a pair of first select gate lines provided between a first pair of the word lines and extending in the second direction; a pair of second select gate lines provided between a second pair of the word lines and extending in the second direction; memory cell transistors each provided at each of intersections of the active regions and the word lines on the surface of the semiconductor substrate; select gate transistors each provided at each of intersections of the active regions and the first select gate lines and intersections of the active regions and the second select gate lines on the surface of the semiconductor substrate; a first contact contacting adjacent two of the active regions between the pair of first select gate lines; and a second contact contacting one of the active regions between the pair of second select gate lines.

According to an aspect of the present invention, there is provided a nonvolatile semiconductor memory device comprising: a semiconductor substrate; active regions formed on a surface of the semiconductor substrate, separated from one another by element separating regions and extending in a first direction; a first word line and a second word line both extending in a second direction crossing the first direction; a pair of first select gate lines extending in the second direction between the first word line and the second word line; memory cell transistors each provided at each of intersections of the first and second word lines and the active regions on the surface of the semiconductor substrate; select gate transistors each provided at each of intersections of the pair of first select gate lines and the active regions on the surface of the semiconductor substrate; and contacts each contacting each of the active regions between the pair of first select gate lines, two of the contacts which contact adjacent two of the active regions being positioned at different points on an axis extending in the first direction.

BRIEF DESCRIPTION OF THE SEVERAL VIEWS OF THE DRAWING

FIG. 10 schematically shows a plane pattern in an area around CS contacts of the nonvolatile semiconductor memory device according to a second embodiment;

FIG. 22 schematically shows a plane pattern in an area around CS contacts of the nonvolatile semiconductor memory device according to a fifth embodiment;

FIG. 31 is a schematic circuit diagram of an AND memory cell array of a nonvolatile semiconductor memory device according to a seventh embodiment;

FIG. 35 is a schematic block diagram showing a flash memory device and system, which uses the nonvolatile semiconductor memory device according to the first to tenth embodiments;

FIG. 36 is a schematic block diagram showing an internal structure of a memory card to which the nonvolatile semiconductor memory device according to the first to tenth embodiments is applied;

FIGS. 37 to 40 are schematic block diagrams each showing an internal structure of a memory card to which the nonvolatile semiconductor memory device according to the first to tenth embodiments is applied;

FIG. 42 schematically shows a connection device capable of accepting the memory card and the card holder to which the nonvolatile semiconductor memory device according to the first to tenth embodiments is applied;

FIG. 43 schematically shows a coupling device for containing the memory card to which the nonvolatile semiconductor memory device according to the first to tenth embodiments is applied;

FIG. 44 shows a digital camera system capable of incorporating the memory card to which the nonvolatile semiconductor memory device according to the first to tenth embodiments is applied;

FIG. 45 schematically shows an IC card to which the nonvolatile semiconductor memory device according to the first to tenth embodiments is applied; and FIGS. 46 to 49 are schematic block diagrams each showing an internal structure of the IC card to which the nonvolatile semiconductor memory device according to the first to tenth embodiments is applied.

DETAILED DESCRIPTION OF THE INVENTION

First to tenth embodiments of the present invention will be described with reference to the accompanying drawings. Throughout the drawings, like or equivalent portions are designated by like or equivalent reference symbols. Note that the drawings are schematic, and that relation of thickness to plane size, ratio of thicknesses of the layers, and others may not be actual ones. Accordingly, specific thicknesses and dimensions of various parts and components should be determined from the following description. Dimensional relations and thickness ratios may also be different among the drawings.

Note that the first to tenth embodiments are exemplary devices and methods for embodying the technical idea of the present invention, and that the technical idea does not limit materials, shapes, structures, and layouts of the components to those described hereunder. Various modifications can be performed on the technical idea of the invention within scope of claims.

The aforementioned description takes the NAND flash EEPROM as an example. Memories of other types, such as AND-, NOR-, 2-transistor/cell- and 3-transistor/cell-types which include serially-arranged source line contacts CS, also regards that it is highly important to secure the micro-fabrication and fabrication margin in a region to form source line contacts CS.

First Embodiment (Plane Pattern Structure)

Figure 1:
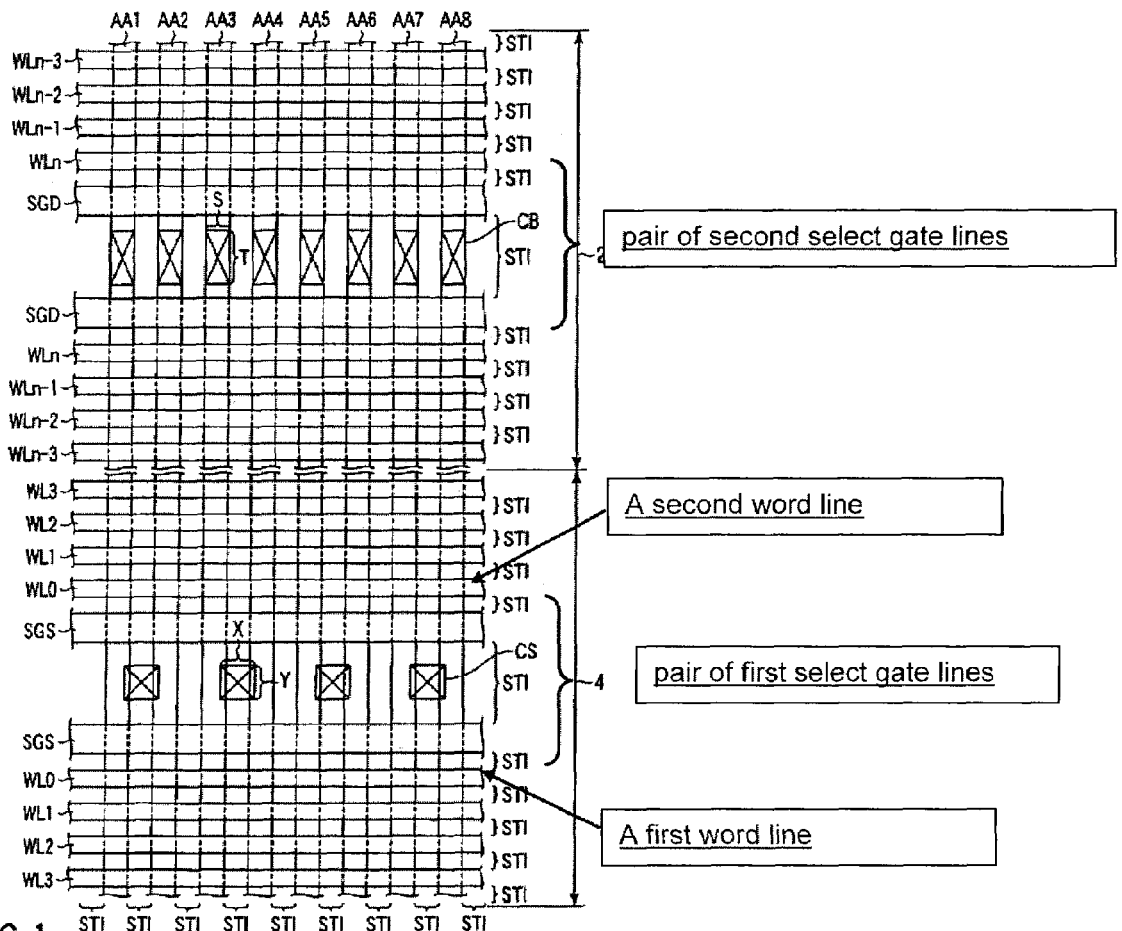
FIG. 1 schematically shows a plane pattern of a memory cell array of a nonvolatile semiconductor memory device according to a first embodiment.

FIG. 1 schematically shows a plane pattern of a memory cell array of a nonvolatile semiconductor memory device according to a first embodiment of the present invention. FIG. 1 shows plane pattern configurations in a CB contact region 2 and a CS contact region 4. A layout of bit line contacts CB in the CB contact region 2 is common to first to sixth embodiments to be described hereunder. A layout of source line contacts CS in the CS contact region 4 is different among the first to sixth embodiments.

Figure 2:
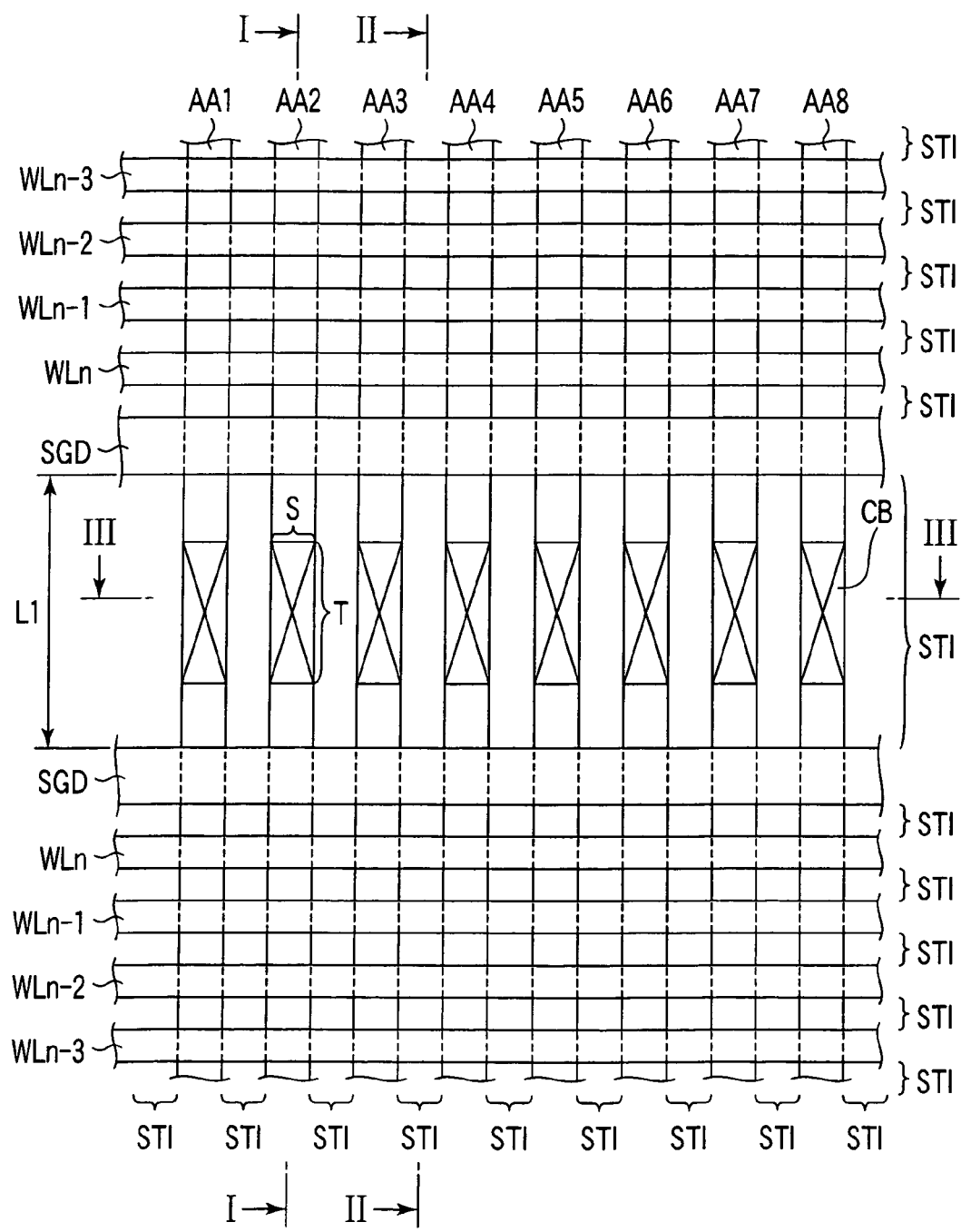
FIG. 2 schematically shows a plane pattern in an area around CB contacts of the nonvolatile semiconductor memory device according to the first embodiment.

FIG. 2 schematically shows a plane pattern in the CB contact region 2 of the semiconductor memory device according to the first embodiment.

Figure 6:
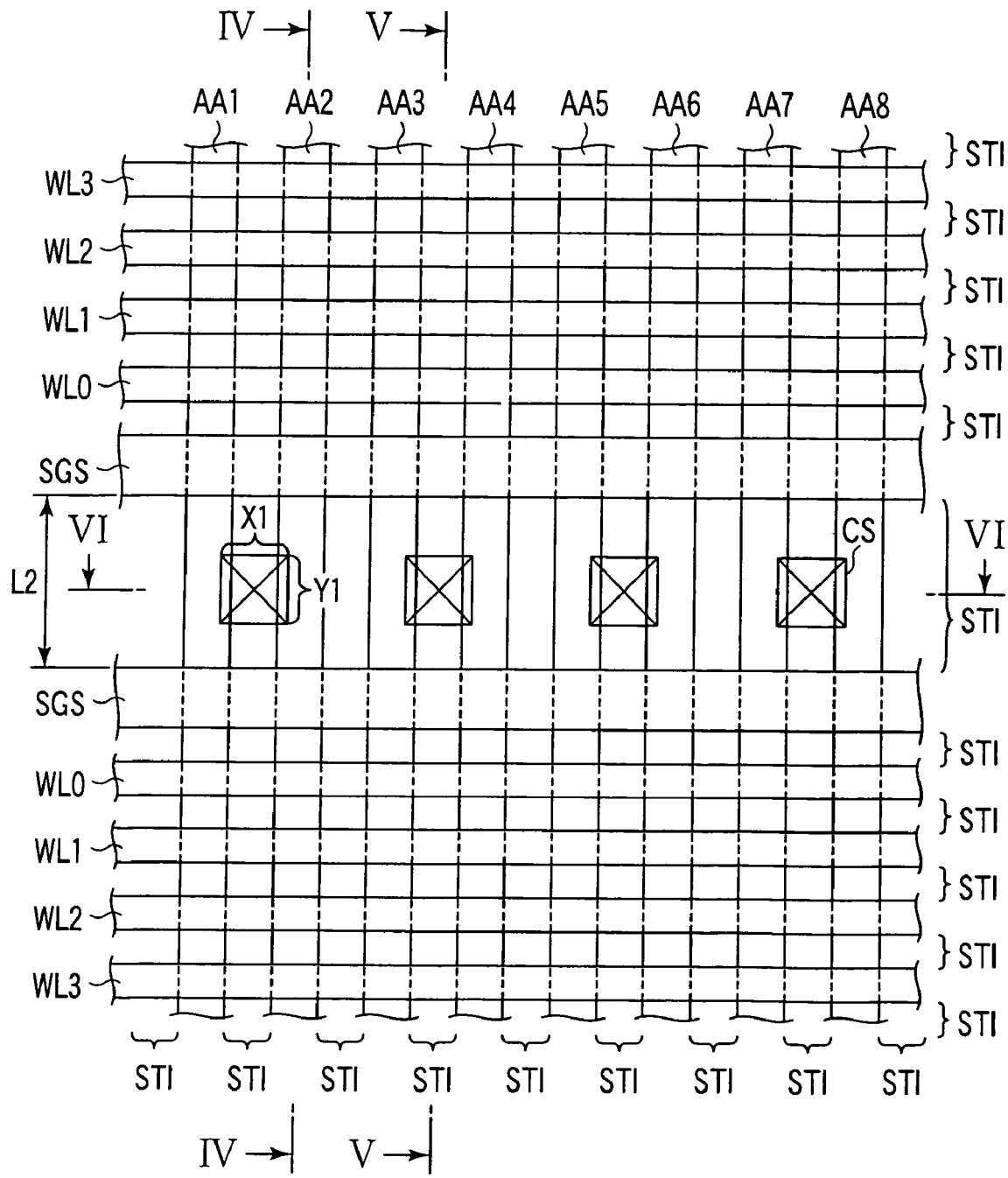
FIG. 6 schematically shows a plane pattern in an area around CS contacts of the nonvolatile semiconductor memory device according to the first embodiment.

FIG. 6 schematically shows a plane pattern of the CS contact region 4 of the semiconductor memory device according to the first embodiment.

As shown in FIGS. 1, 2 and 6, the semiconductor memory device of the first embodiment includes active regions AA1, AA2, AA3, ... AA8, ..., a group of word lines WL0, WL1, WL2, ... WLn, a pair of bit-line side select gate line SGD, a pair of source-line side select gate lines SGS, memory cell transistors, select gate transistors, bit line contacts CB, and source line contacts CS.

The active regions AA1, AA2, AA3, ... AA8, ..., extend in the column direction and separated from one another by element separation regions STI. The active regions AA1, AA2, AA3, ... AA8, ... and the element separation regions STI may be laid out in the minimum line and space pattern. In this case, the lengths of the active regions AA1, AA2, AA3, ... AA8, ... and the element separation regions STI in a row direction correspond each to the minimum line width.

The word lines WL0, WL1, WL2, ... WLn are orthogonal to the active regions AA1, AA2, AA3, ... AA8, ..., and extend in the row direction.

The pair of the bit-line side select gate line SGD are located between a pair of word lines WL0, WL1, WL2, ... WLn, and extend parallel to the word lines WL0, WL1, WL2, ... WLn.

The pair of the source-line side select gate line SGS are located between the word lines WL0, WL1, WL2, ... WLn, and extend parallel to the word lines WL0, WL1, WL2, ... WLn.

Each memory cell transistors are located at the intersections of the active regions AA1, AA2, AA3, ... AA8, ... and the word lines WL0, WL1, WL2, ... WLn.

The select gate transistors are located at the intersections of the active regions AA1, AA2, AA3, ... AA8, ... and the bit-line side select gate lines SGD and the source-line side select gate lines SGS. The select gate transistors are adjacent to the memory cell transistors.

The bit line contacts CB are located between the pair of bit-line side select gate lines SGD and are connected to the active regions AA1, AA2, AA3, ... AA8, .... The bit line contacts CB are adjacent to the select gate transistors.

The source line contacts CS are located between the pair of source-line side select gate lines SGS and connected to the active regions AA1, AA2, AA3, ... AA8, ..., and to two adjacent active regions of those active regions AA1, AA2, AA3, ... AA8, .... The source line contacts CS are adjacent to the select gate transistors.

As shown in FIGS. 1, 2 and 6, a size S of the shorter side of each of the bit line contacts CB, which electrically connect to the active regions AA1, AA2, AA3, ... AA8, ... is the shortest in the NAND flash EEPROM. Thus, a size in the longer side of each of the bit line contacts CB needs to be long. This requires the interval between the bit-line side select gate lines SGD to be long enough to keep the bit-line side select gate lines SGD from contacting the bit line contacts CB.

Meanwhile, adjacent source line contacts CS do not need to be insulated unlike in the CB contact region 2. Accordingly, the size in the longer side of each source line contact CS does not need to so long as the bit line contacts CB. This can reduce the distance between the source-line side select gate lines SGS.

Under such a circumstance, forming rectangular (ditch) source line contacts CS is unnecessary and unnecessarily decrease fabrication margin due to a large shape difference between the normal square (hollow) contact and the rectangular thereof. Therefore, the source line contact CS according to the semiconductor memory device of the first embodiment is hollow and larger than the conventional one.

Specifically, as shown in FIG. 6, each source line contact CS has a length X1 in the row direction, which is long enough to reach adjacent two active regions. A length Y1 in the column direction of the source line contact is equal to or somewhat shorter than the length X1. This design is chosen because short length Y1 in the column direction is desired in order to reduce the space between the source-line side select gate lines SGS. The length X1 can be longer than the width of the element separation region STI to allow the source line contact CS to extend onto the two adjacent active regions.

Alternatively, the length X1 in the row direction of the source line contact CS is shorter than twice as long as the width of each of the active regions AA1, AA2, AA3, ... AA8, ....

<Cross Sectional Structure>

Figure 3:
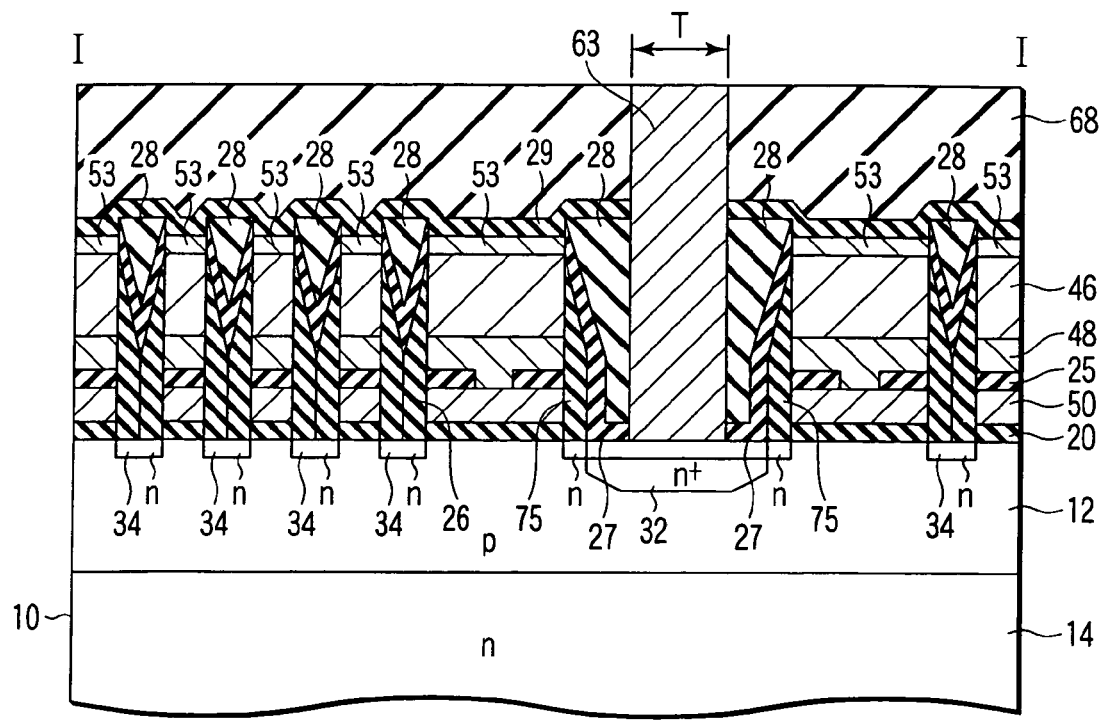
FIG. 3 schematically shows cross section along line I-I in FIG. 2.
Figure 4:
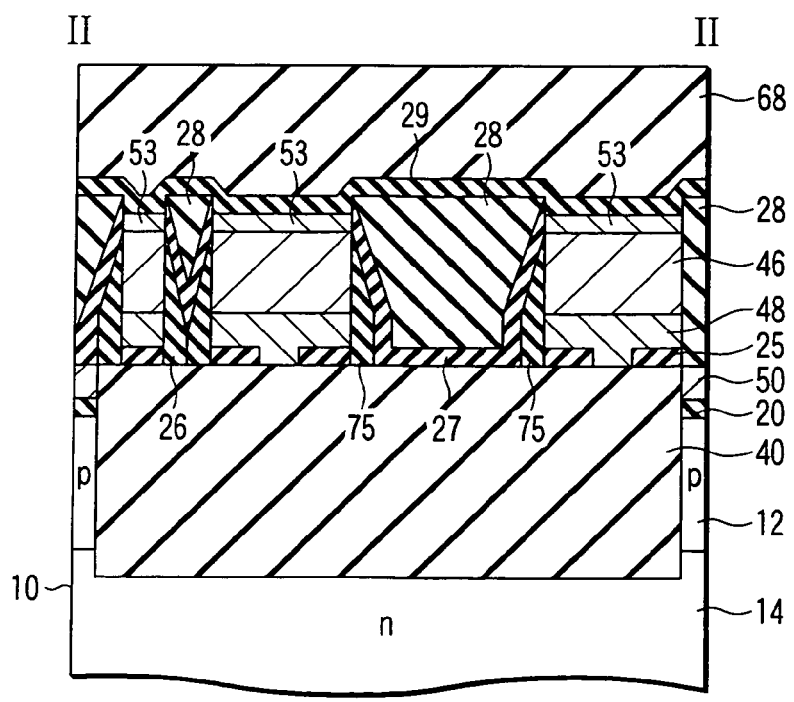
FIG. 4 schematically shows cross section along line II-II in FIG. 2.
Figure 5:
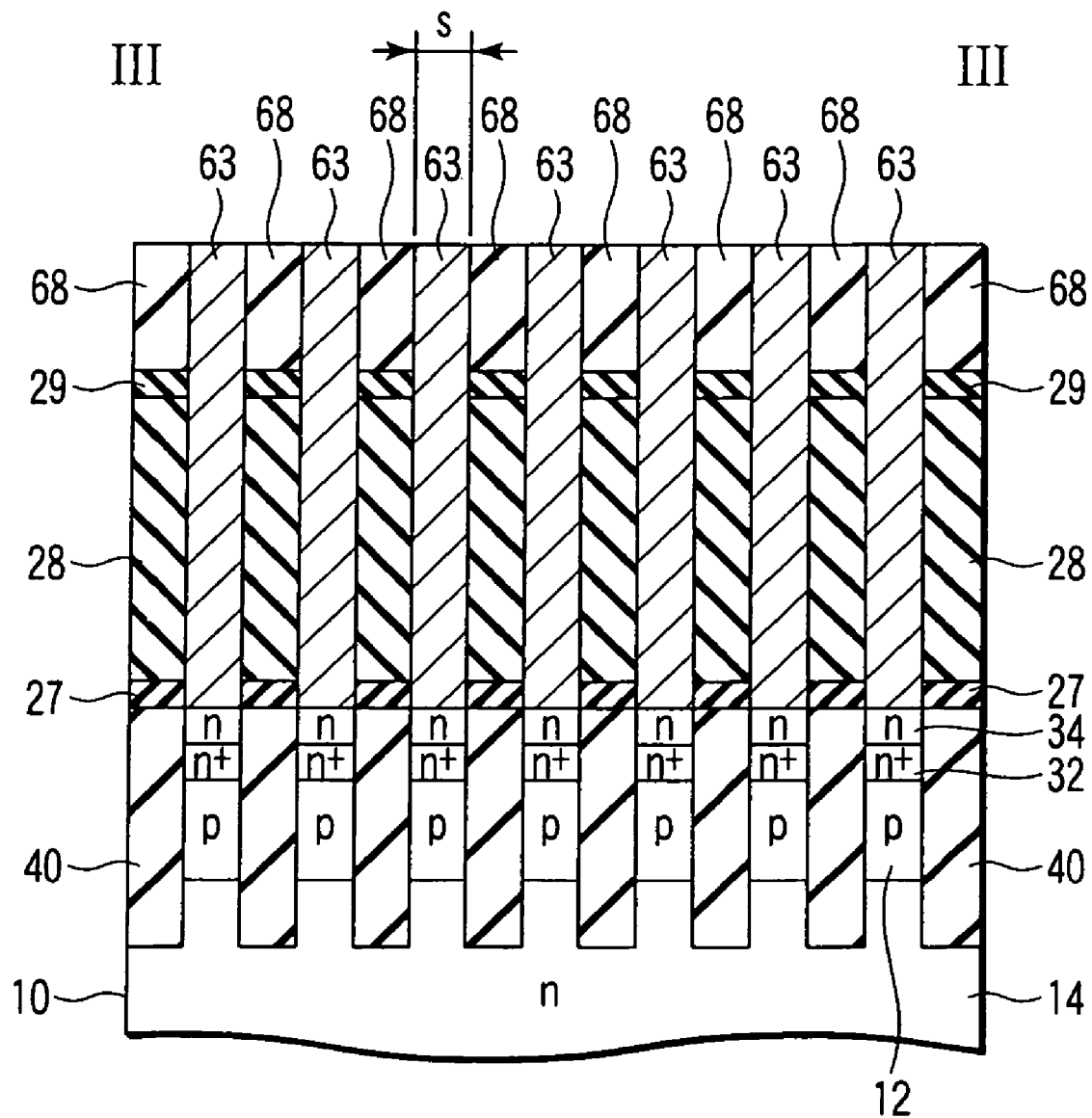
FIG. 5 schematically shows cross section along line III-III in FIG. 2.

FIGS. 3 to 5 show cross sectional structures of the bit line contacts CB and their periphery in the semiconductor memory device of the first embodiment. FIG. 3 schematically shows a cross sectional structure along line I-I in FIG. 2. FIG. 4 schematically shows a cross sectional structure along line II-II in FIG. 2. FIG. 5 schematically shows a cross sectional structure along line III-III in FIG. 2. In FIG. 2, the line I-I extends in the column direction on the active region AA2. The line II-II extends in the column direction on the element separation region between the active regions AA3 and AA4. The line III-III extends in the row direction between the bit-line side select gate lines SGD.

Figure 7:
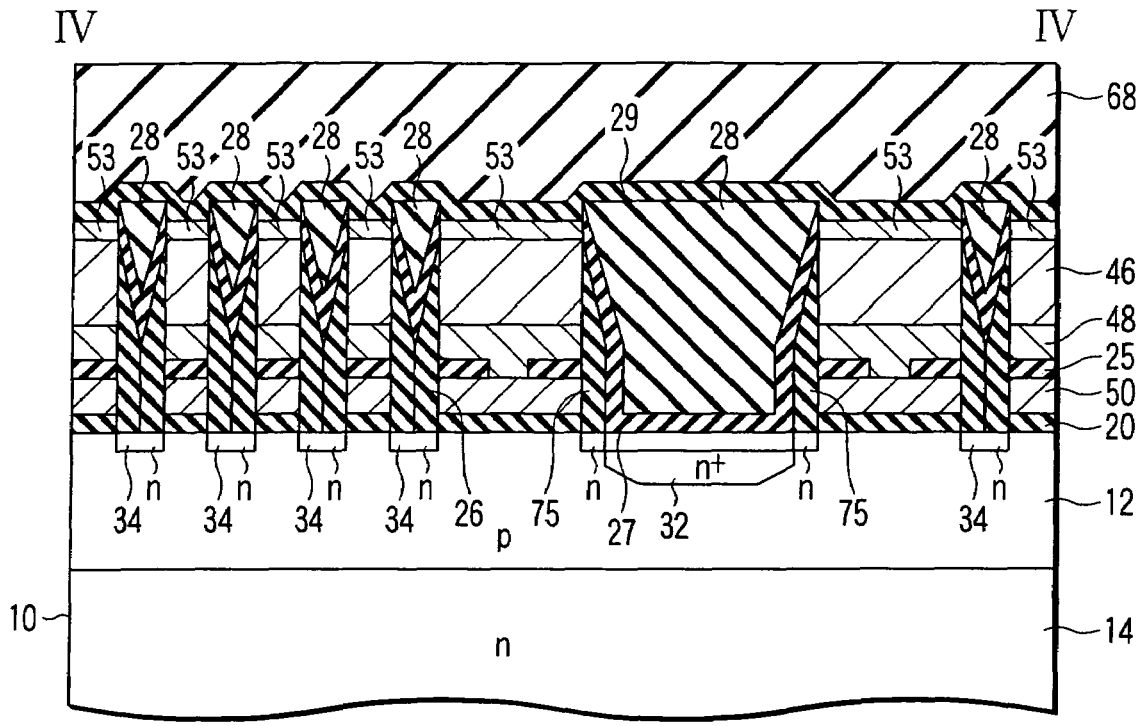
FIG. 7 schematically shows cross section along line IV-IV in FIG. 6.
Figure 8:
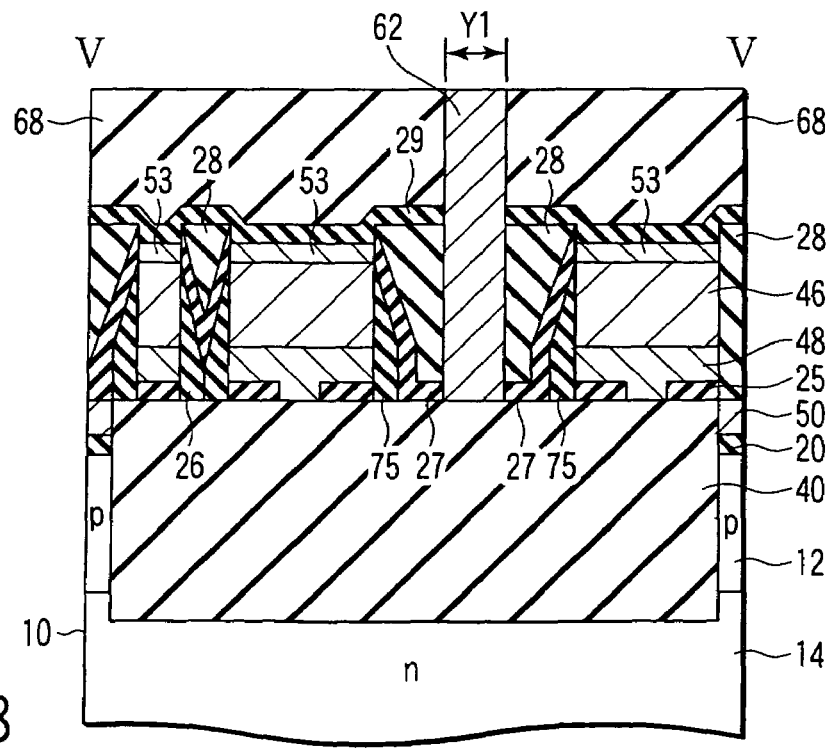
FIG. 8 schematically shows cross section along line V-V in FIG. 6.
Figure 9:
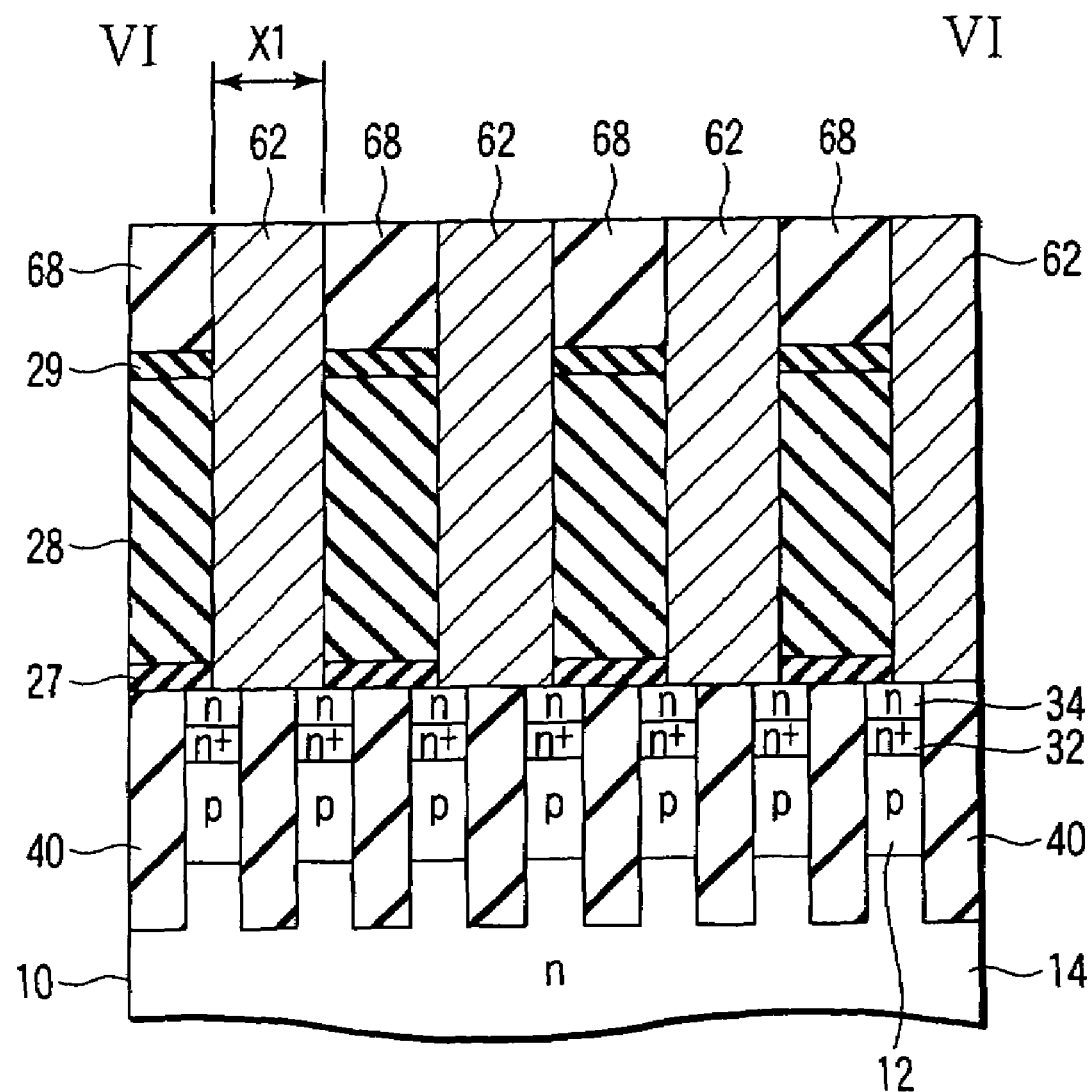
FIG. 9 schematically shows cross section along line VI-VI in FIG. 6.

FIGS. 7 to 9 show cross sectional structures of the source line contacts CS and their periphery in the semiconductor memory device of the first embodiment. FIG. 7 schematically shows a cross sectional structure along line IV-IV in FIG. 6. FIG. 8 schematically shows a cross sectional structure along line V-V in FIG. 6. FIG. 9 schematically shows a cross sectional structure along line VI-VI in FIG. 6. In FIG. 6, the line IV-IV extends in the column direction on the active region AA2. The line V-V extends in the column direction on the element separation region between the active regions AA3 and AA4. The line VI-VI extends in the row direction between the bit-line side select gate lines SGD.

As shown in FIGS. 3 to 7, the memory cell transistor in the semiconductor memory device of the first embodiment may include a semiconductor substrate 10, an n-well region 14 and a p-well region 12, a tunnel insulating film 20, a floating gate electrode layer 50, a intergate insulating film 25, a first control gate electrode layer 48, a second control gate electrode layer 46, and a metal silicide film 53.

The n-well region 14 and the p-well region 12 are formed in the semiconductor substrate 10. The tunnel insulating film 20 is located on the semiconductor substrate 10. The floating gate electrode layer 50 is located on the tunnel insulating film 20. The intergate insulating film 25 is located on the floating gate electrode layer 50. The first control gate electrode layer 48 is located on the intergate insulating film 25. The second control gate electrode layer 46 is located on the first control gate electrode layer 48. The metal silicide film 53 is in electrical contact with the upper part of the second control gate electrode layer 46.

Since the second control gate electrode layer 46 corresponds to the word line, the metal silicide film 53 forms the word line. A barrier insulating film 29 is formed on the metal silicide film 53, and an interlayer insulating film 68 is deposited on the barrier insulating film 29. Metal silicide may be any of various kinds of metal silicide, such as cobalt silicide ($CoSi_2$) and nickel silicide ($NiSi_2$).

An intergate buried insulating film 26, a liner insulating film 27, and an interlayer insulating film 28 are buried between the first and second control gate electrode layers 48 and 46 of adjacent memory cell transistors.

The select gate transistor is located adjacent to the memory cell transistor and may include the semiconductor substrate 10, the n-well region 14 and the p-well region 12, the tunnel insulating film 20, the floating gate electrode layer 50, the intergate insulating film 25, the first control gate electrode layer 48, the second control gate electrode layer 46, and the metal silicide film 53.

The n-well region 14 and the p-well region 12 are formed in the semiconductor substrate 10. The tunnel insulating film 20 is located on the semiconductor substrate 10. The floating gate electrode layer 50 is located on the tunnel insulating film 20. The intergate insulating film 25 is located on the floating gate electrode layer 50, and has an opening. The first control gate electrode layer 48 is located on the intergate insulating film 25. The second control gate electrode layer 46 is located on the first control gate electrode layer 48.

The metal silicide film 53 is in electrical contact with the upper part of the second control gate electrode layer 46. The barrier insulating film 29 is formed on the metal silicide film 53, and the interlayer insulating film 68 is deposited on the barrier insulating film 29.

The floating gate electrode layer 50 and the first control gate electrode layer 48 are electrically interconnected through the opening of the intergate insulating film 25. Accordingly, the floating gate electrode layer 50, the first control gate electrode layer 48, the second control gate electrode layer 46 and the metal silicide film 53 are electrically equal to be the gate electrode of the select gate transistors, and form the select gate lines SGD and SGS. Reference numeral 40 indicates an element separation region (STI).

As shown in FIGS. 3, 4, 7 and 8, a gate side insulating film 75, the liner insulating film 27 and the interlayer insulating film 28 are buried between the first and second control gate electrode layers 48 and 46 of adjacent select gate transistors.

The bit line contact CB lies adjacent to the select gate transistor and is formed on an n source/drain diffusion layer 34 and an n+ source/drain diffusion layer 32 as shown in FIGS. 3 and 5. The interlayer insulating film 68, the barrier insulating film 29, the interlayer insulating film 28, and the liner insulating film 27 are removed by lithography process and etching process to form a bit line contact (CB) plug 63 on the n source/drain diffusion layer 34 and the $n^+$ source/drain diffusion layer 32.

As shown in FIG. 5, a size S in the shorter side of the bit line contact CB is substantially equal to a length in the row direction of the active region. The bit line contacts CB need to be insulated from one another. As shown in FIG. 3, a length T in the longer side of the bit line contact CB may be much longer than the size S thereof in the shorter side.

As shown FIGS. 8 and 9, the source line contact CS lies adjacent to the select gate transistor and may extend over adjacent source/drain diffusion layers 34. The interlayer insulating film 68, the barrier insulating film 29, the interlayer insulating film 28, an the liner insulating film 27 are removed by lithography process and etching process to form source line contacts (CS) 62 on the adjacent source/drain diffusion layers 34.

In the semiconductor memory device of the first embodiment, the source line contacts CS are each formed to extend on adjacent source/drain diffusion layers 34. This structure can secure the fabrication margin of the source line contacts CS. Further, the space between the select gate lines SGS can be reduced to realize a smaller, more highly integrated and more easily fabricable memory cell array.

Second Embodiment

FIG. 10 schematically shows a plane pattern of CS contact region of a nonvolatile semiconductor memory device according to a second embodiment of the invention.

As shown in FIG. 10, a structure of the semiconductor memory device of the second embodiment is the same as the corresponding one of the first embodiment (FIG. 6) except for the structure of the source line contacts CS. Each source line contact CS of the semiconductor memory device of the second embodiment extends sufficiently onto two of active regions AA1, AA2, AA3, . . . AA8, . . . .

Forming rectangular (ditch) source line contacts CS is unnecessary and unnecessarily decrease fabrication margin due to a large shape difference between the normal square (hollow) contact and the rectangular thereof. Therefore, the source line contact CS according to the semiconductor memory device of the second embodiment is hollow and larger than the conventional one. Specifically, as shown in FIG. 10, the source line contact CS is relatively large and equal in size to almost two active regions.

A specific length X2 of the source line contact CS which is large enough to extend sufficiently onto two adjacent active regions may be, as illustrated in FIG. 10, about twice as long as the length in the row direction of the active region. A length Y2 in the column direction is equal to or shorter than the length X2. Shorter length Y2 in the column direction is desirable in order to reduce the space between the select gate lines SGS.

When the element separation regions STI and the active regions AA1, AA2, AA3, . . . AA8, . . . are arrayed in the line and space pattern of the minimum line width, the length X2 in the row direction may be about twice as long as the minimum line width to allow the source line contact CS to extend sufficiently onto the two adjacent active regions.

(Cross Sectional Structure)

Figure 11:
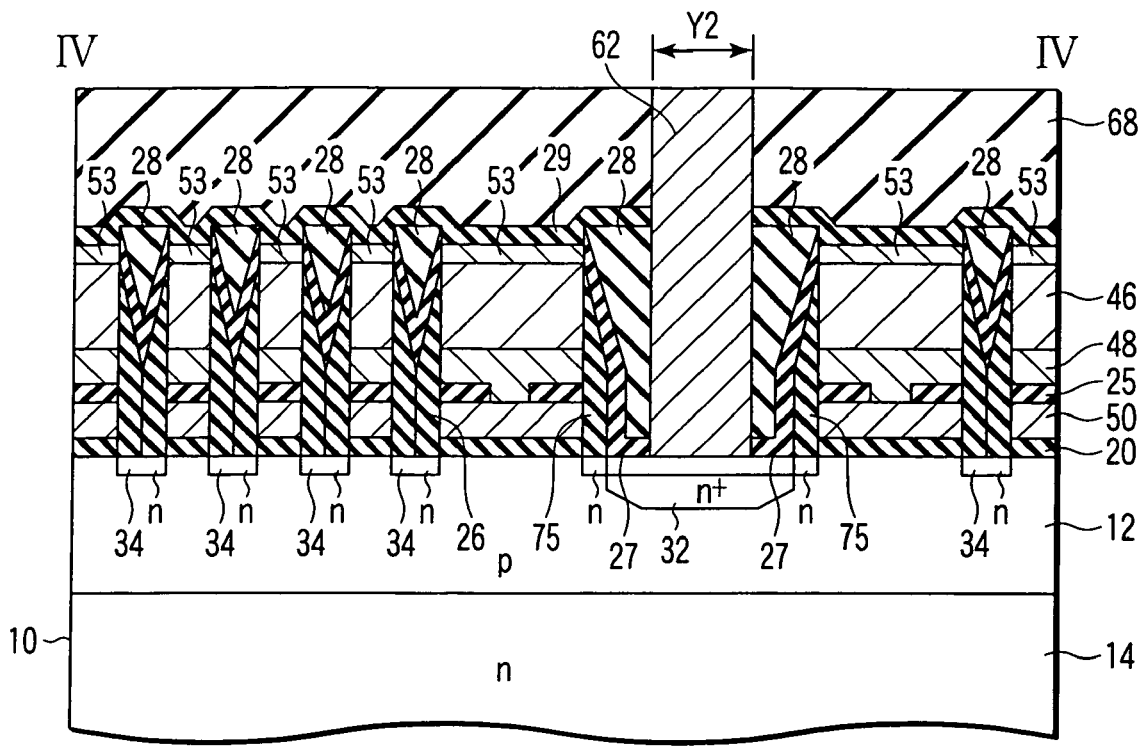
FIG. 11 schematically shows cross section along line IV-IV in FIG. 10.
Figure 12:
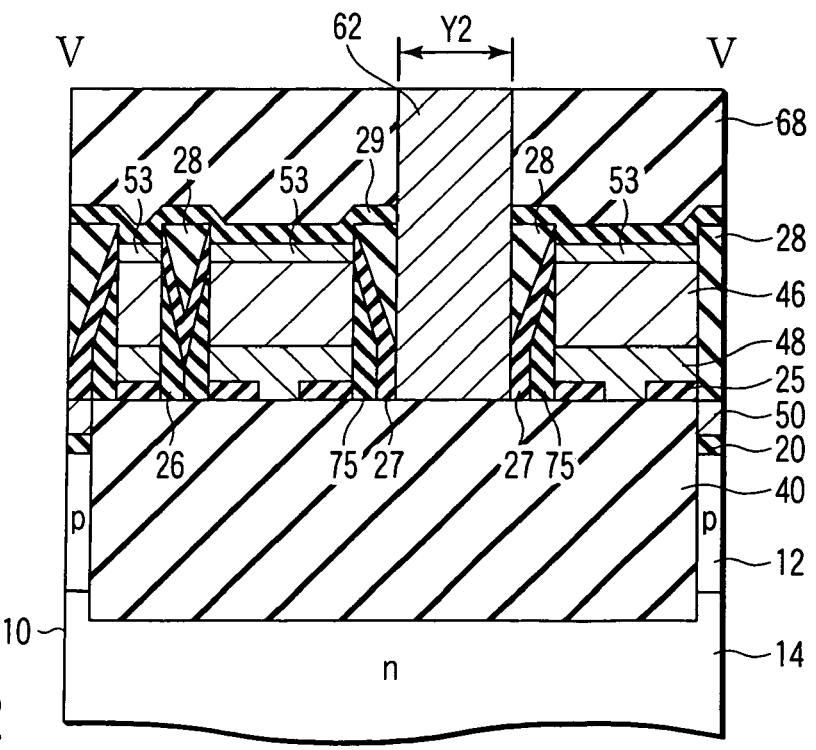
FIG. 12 schematically shows cross section along line V-V in FIG. 10.
Figure 13:
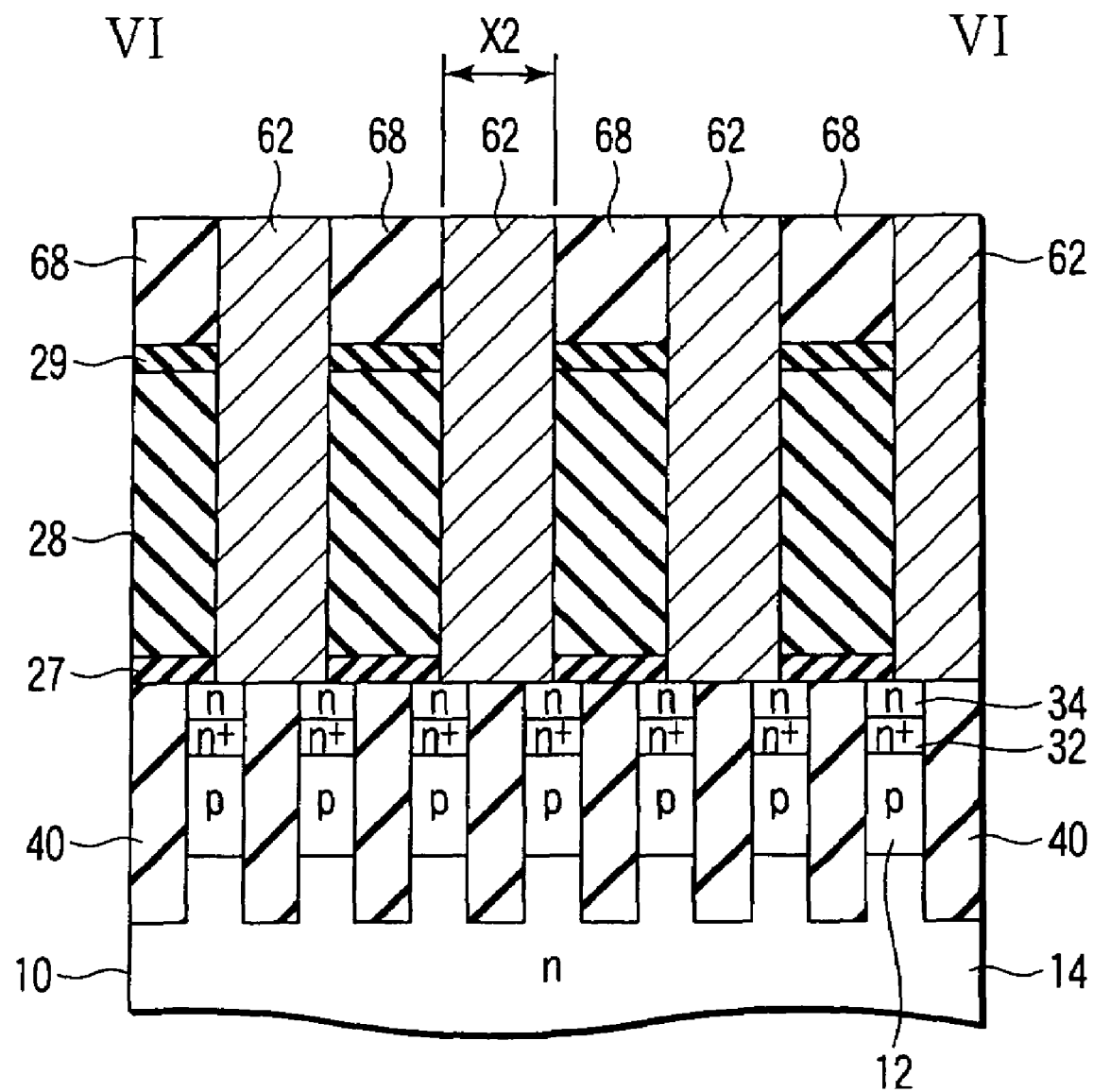
FIG. 13 schematically shows cross section along line VI-VI in FIG. 10.

FIGS. 11 to 13 show cross sectional structures of the source line contacts CS and their periphery in a semiconductor memory device of the second embodiment. FIG. 11 schematically shows a cross sectional structure along line IV-IV in FIG. 10. FIG. 12 schematically shows a cross sectional structure along line V-V in FIG. 10. FIG. 13 schematically shows a cross sectional structure along line VI-VI in FIG. 10. In FIG. 10, the line IV-IV extends in the column direction on the active region AA2. The line V-V extends in the column direction on the element separation region between the active regions AA3 and AA4. The line VI-VI extends in the row direction between the select gate lines SGS.

The memory cell transistors, the select gate transistors, and the bit line contacts CB in the semiconductor memory device of the second embodiment have substantially the same structures as those in the first embodiment. Accordingly, no further description is given here.

As shown in FIGS. 11 to 13, the length X2 in the row direction of the source line contact CS in the semiconductor memory device of the second embodiment is about twice as long as the minimum line width. This length ensures that the source line contact extends sufficiently onto adjacent source/drain diffusion layers 34. The interlayer insulating film 68, the barrier insulating film 29, the interlayer insulating film 28, and the liner insulating film 27 are removed by lithography process and etching process to form a source line contact (CS) plug 62 which extends efficiently onto the adjacent source/drain diffusion layers 34.

In the semiconductor memory device of the second embodiment, the source line contact CS whose length X2 in the row direction is about twice as long as the minimum line width extends sufficiently onto adjacent source/drain diffusion layers 34. This structure can secure the fabrication margin of the source line contacts CS. Further, the space between the select gate lines SGS can be reduced to realize a smaller, more highly integrated and more easily fabricable memory cell array.

Third Embodiment

Figure 14:
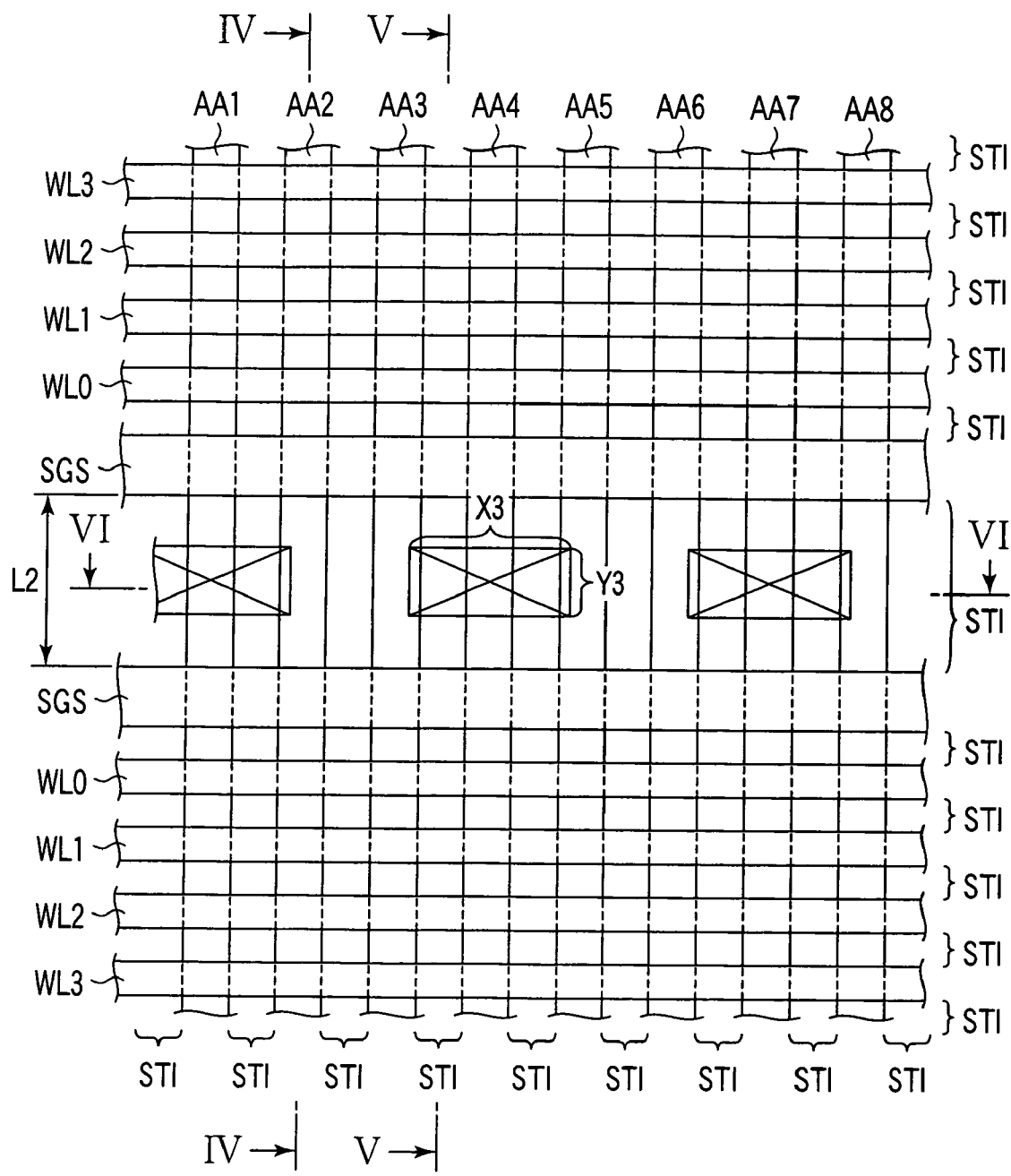
FIG. 14 schematically shows a plane pattern in an area around CS contacts of the nonvolatile semiconductor memory device according to a third embodiment.

FIG. 14 schematically shows a plane pattern of the CS contact region in a nonvolatile semiconductor memory device according to a third embodiment of the invention.

As shown in FIG. 14, a structure of the semiconductor memory device of the third embodiment is the same as the corresponding one of the first embodiment (FIG. 6) except for the structure of the source line contacts CS. Each source line contact CS of the semiconductor memory device of the third embodiment extends sufficiently onto three of active regions AA1, AA2, AA3, . . . AA8, . . . .

Forming rectangular (ditch) source line contacts CS is unnecessary and unnecessarily decrease fabrication margin due to a large shape difference between the normal square (hollow) contact and the rectangular thereof. Therefore, the source line contacts CS according to the semiconductor memory device of the third embodiment are each located on three of the active regions AA1, AA2, AA3, . . . AA8, . . . , using the source line contact (CS) 62 buried in trenches. In other words, the source line contact CS extends over three active regions.

A specific length X3 of the source line contact CS which is large enough to extend onto three adjacent active regions may be, as illustrated in FIG. 14, longer than three times as long as the length in the row direction of each of the active regions AA1, AA2, AA3, . . . AA8, . . . and shorter than four times as long as the same. A length Y3 in the column direction of the source line contact is much shorter than the length X3, or may be almost equal to the minimum line width. Shorter length Y3 in the column direction is desirable in order to reduce the space between the select gate lines SGS.

When the element separation regions STI and the active regions AA1, AA2, AA3, . . . AA8, . . . are arrayed in the line and space pattern of the minimum line width, the length X3 in the row direction may be longer than three times as long as the minimum line width and shorter than four times as long as the same to allow the source line contact CS to extend onto the three adjacent active regions.

(Cross Sectional Structure)

Figure 15:
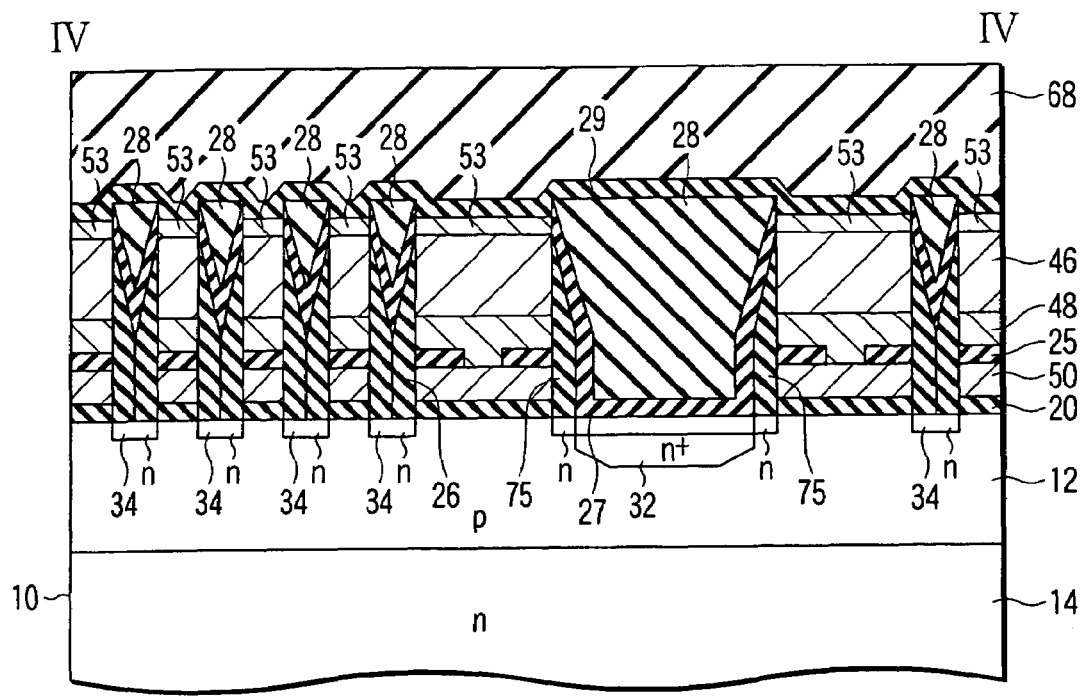
FIG. 15 schematically shows cross section along line IV-IV in FIG. 14.
Figure 16:
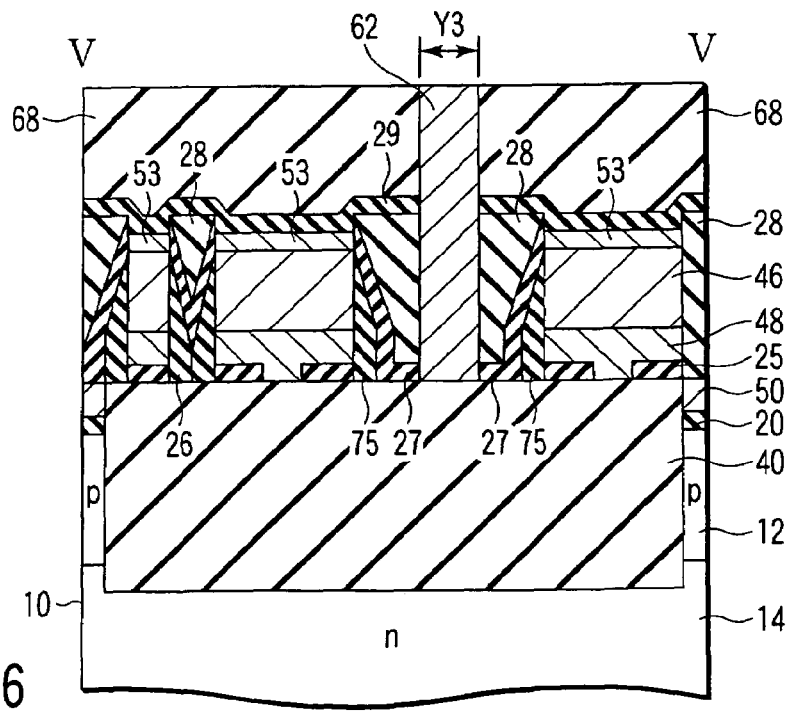
FIG. 16 schematically shows cross section along line V-V in FIG. 14.
Figure 17:
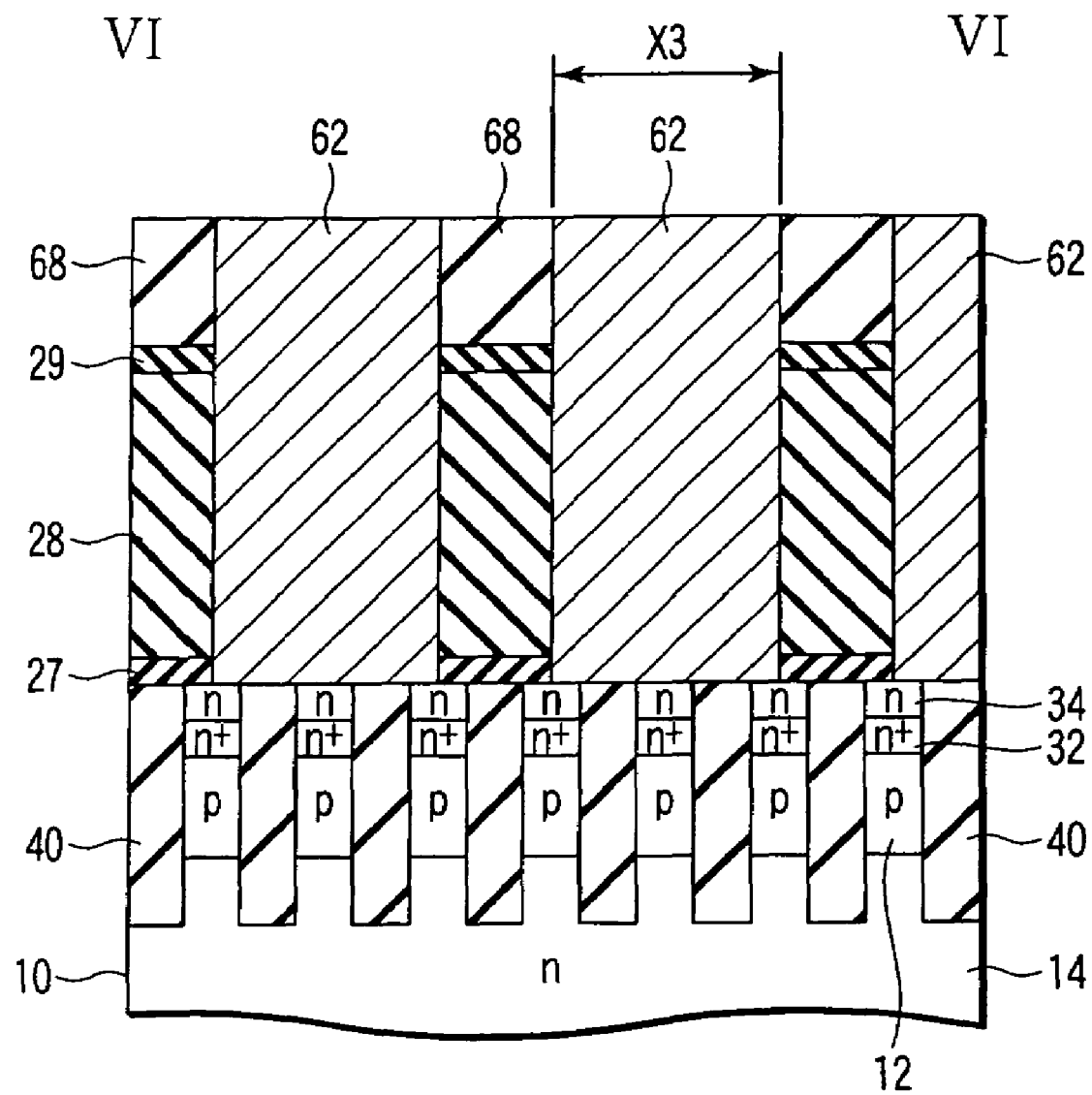
FIG. 17 schematically shows cross section along line VI-VI in FIG. 14.

FIGS. 15 to 17 show cross sectional structures of the source line contacts CS and their periphery in the semiconductor memory device of the third embodiment. FIG. 15 schematically shows a cross sectional structure along line IV-IV in FIG. 14. FIG. 16 schematically shows a cross sectional structure along line V-V in FIG. 14. FIG. 17 schematically shows a cross sectional structure along line VI-VI in FIG. 14. In FIG. 14, the line IV-IV extends in the column direction on the active region AA2. The line V-V extends in the column direction on the element separation region between the active regions AA3 and AA4. The line VI-VI extends in the row direction between the select gate lines SGS.

The memory cell transistors, the select gate transistors, and the bit line contacts CB in the semiconductor memory device of the third embodiment have substantially the same structures as those in the first embodiment. Accordingly, no further description is given here.

As shown in FIGS. 15 to 17, the length X3 in the row direction of the source line contact CS in the semiconductor memory device of the third embodiment is longer than three times as long as the minimum line width and shorter than four times as long as the same. This length ensures that the source line contact extends onto adjacent three source/drain diffusion layers 34. The interlayer insulating film 68, the barrier insulating film 29, the interlayer insulating film 28, and the liner insulating film 27 are removed by lithography process and etching process to form a source line contact (CS) plug 62 which extends onto the three adjacent source/drain diffusion layers 34.

In the semiconductor memory device of the third embodiment, the source line contact CS whose length X3 in the row direction is longer than three times as long as the minimum line width and shorter than four times as long as the same extends onto three adjacent source/drain diffusion layers 34. This structure can secure the fabrication margin of the source line contacts CS. Further, the space between the select gate lines SGS can be reduced to realize a smaller, more highly integrated and more easily fabricable memory cell array.

Fourth Embodiment

Figure 18:
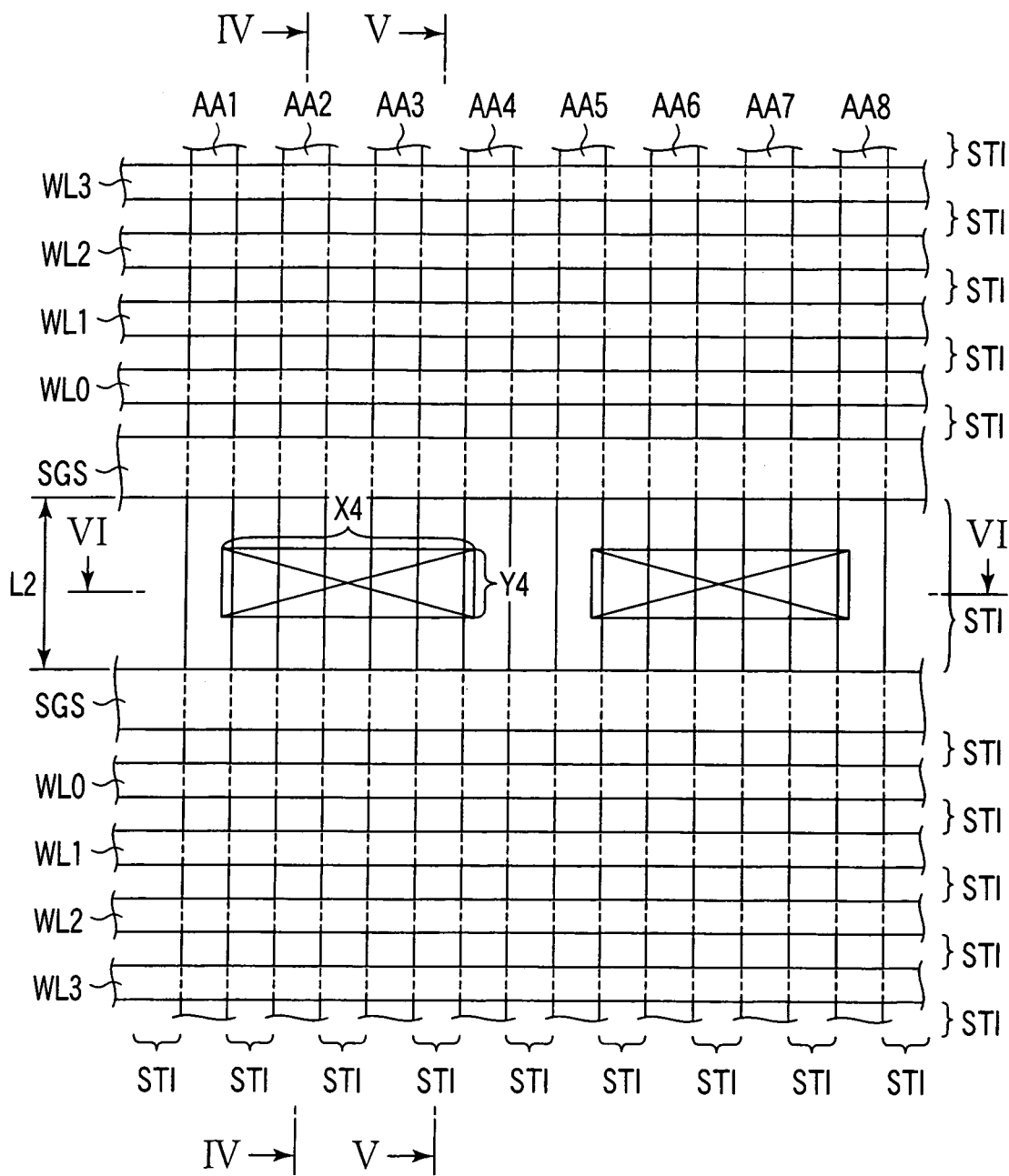
FIG. 18 schematically shows a plane pattern in an area around CS contacts of the nonvolatile semiconductor memory device according to a fourth embodiment.

FIG. 18 schematically shows a plane pattern of the CS contact region in a nonvolatile semiconductor memory device according to a third embodiment of the invention.

As shown in FIG. 18, a structure of the semiconductor memory device of the fourth embodiment is the same as the corresponding one of the first embodiment (FIG. 6) except for the structure of the source line contacts CS. Each source line contact CS of the semiconductor memory device of the fourth embodiment extends onto four of active regions AA1, AA2, AA3, . . . AA8, . . . .

Forming rectangular (ditch) source line contacts CS is unnecessary and unnecessarily decrease fabrication margin due to a large shape difference between the normal square (hollow) contact and the rectangular thereof. Therefore, the source line contacts CS according to the semiconductor memory device of the fourth embodiment are each located on four of the active regions AA1, AA2, AA3, . . . AA8, . . . , using the source line contact (CS) 62 buried in trenches. In other words, the source line contact CS extends over four active regions.

A specific length X4 of the source line contact CS which is large enough to extend onto four adjacent active regions may be, as illustrated in FIG. 18, longer than fifth times as long as the length in the row direction of each of the active regions AA1, AA2, AA3, ... AA8, ... and shorter than sixth times as long as the same. A length Y4 in the column direction of the source line contact is much shorter than the length X4, or may be almost equal to the minimum line width. Shorter length Y4 in the column direction is desirable in order to reduce the space between the select gate lines SGS.

When the element separation regions STI and the active regions AA1, AA2, AA3, ... AA8, ... are arrayed in the line and space pattern of the minimum line width, the length X4 in the row direction may be longer than fifth times as long as the minimum line width and shorter than sixth times as long as the same to allow the source line contact CS to extend onto the four adjacent active regions.

(Cross Sectional Structure)

Figure 19:
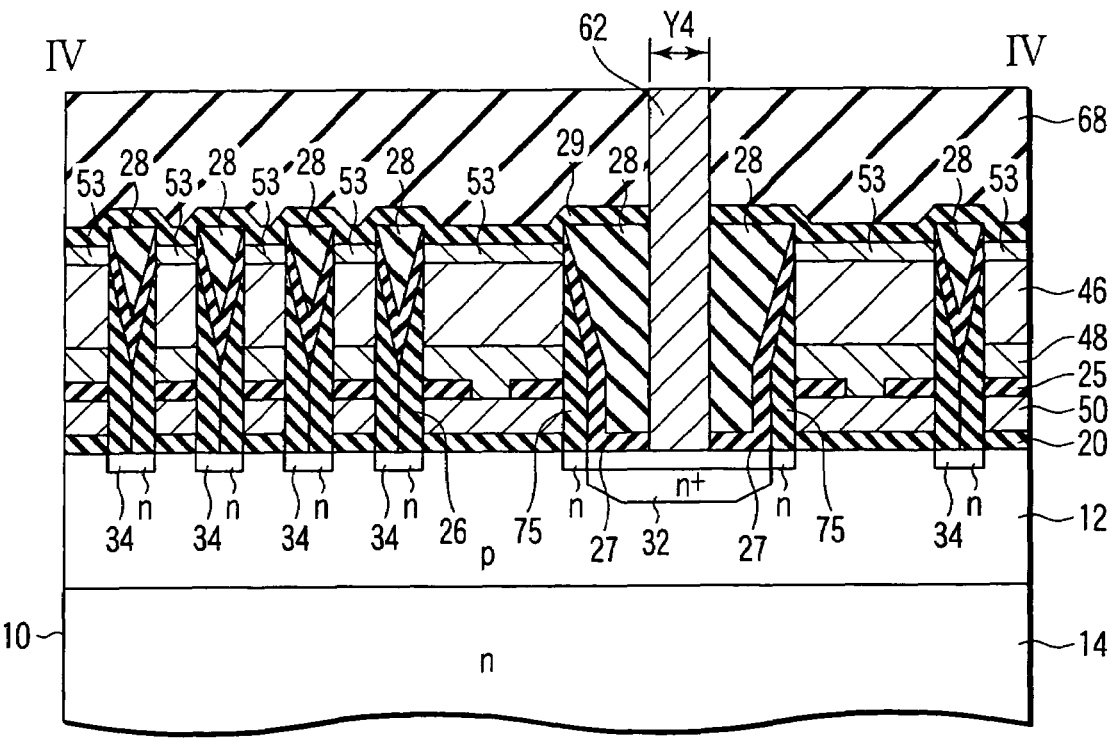
FIG. 19 schematically shows cross section along line IV-IV in FIG. 18.
Figure 20:
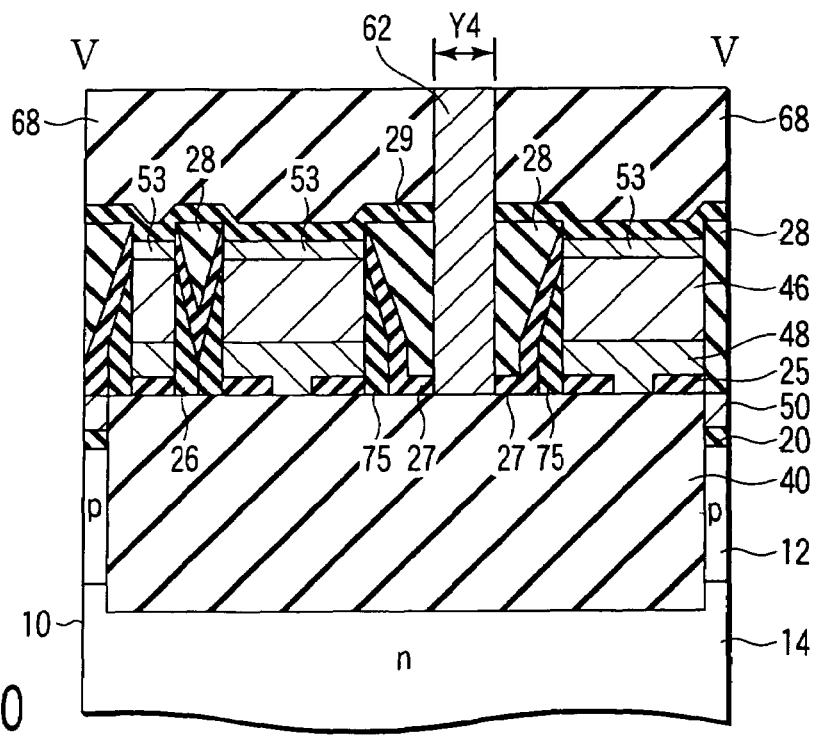
FIG. 20 schematically shows cross section along line V-V in FIG. 18.
Figure 21:
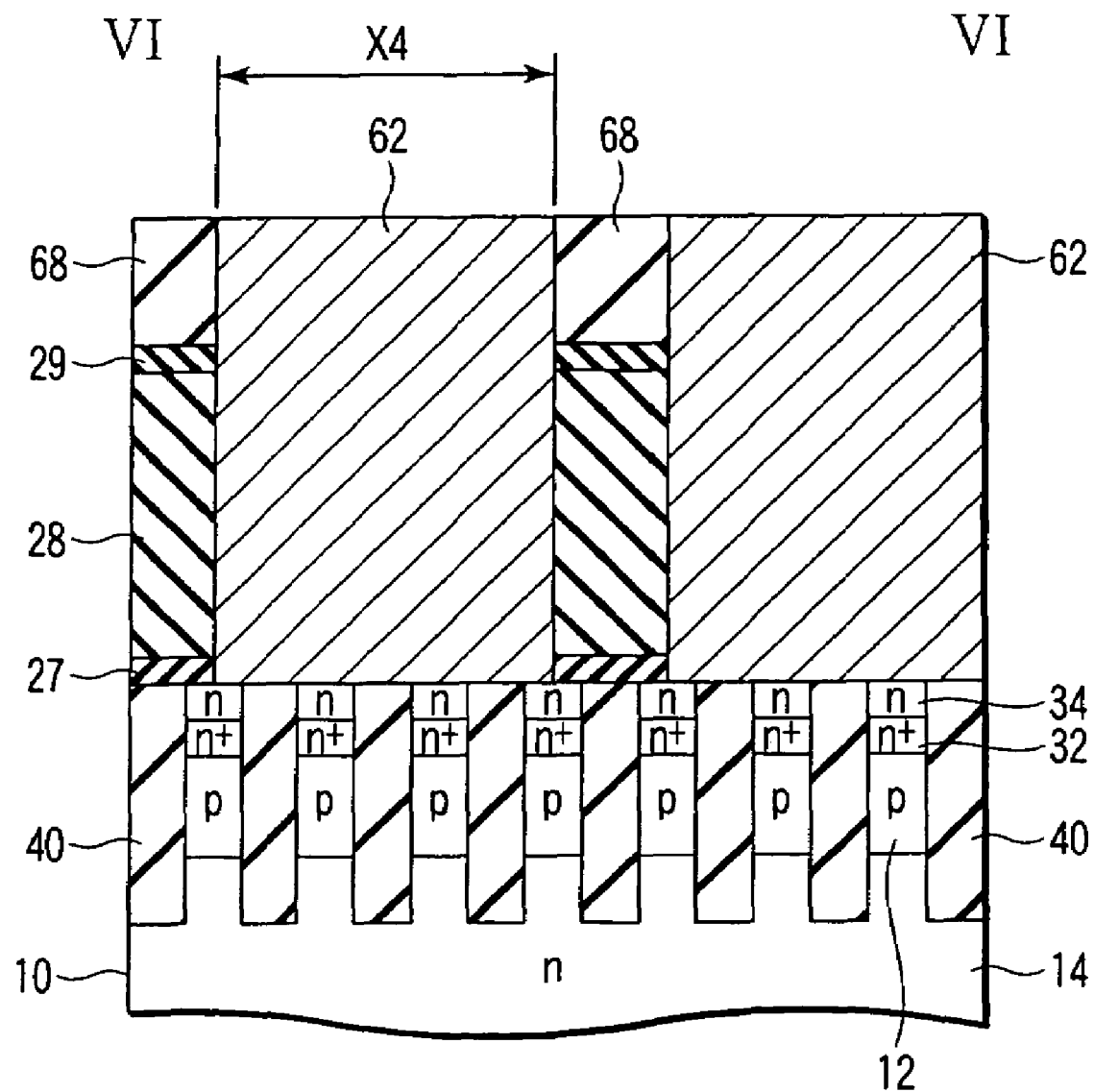
FIG. 21 schematically shows cross section along line VI-VI in FIG. 18.

FIGS. 19 to 21 show cross sectional structures of the source line contacts CS and their periphery in the semiconductor memory device of the fourth embodiment. FIG. 19 schematically shows a cross sectional structure along line IV-IV in FIG. 18. FIG. 20 schematically shows a cross sectional structure along line V-V in FIG. 18. FIG. 21 schematically shows a cross sectional structure along line VI-VI in FIG. 18. In FIG. 18, the line IV-IV extends in the column direction on the active region AA2. The line V-V extends in the column direction on the element separation region between the active regions AA3 and AA4. The line VI-VI extends in the row direction between the side select gate lines SGD.

The memory cell transistors, the select gate transistors, and the bit line contacts CB in the semiconductor memory device of the fourth embodiment have substantially the same structures as those in the first embodiment. Accordingly, no further description is given here.

As shown in FIGS. 19 to 21, the length X4 in the row direction of the source line contact CS in the semiconductor memory device of the fourth embodiment is longer than fifth times as long as the minimum line width and shorter than sixth times as long as the same. This length ensures that the source line contact extends onto adjacent four source/drain diffusion layers 34. The interlayer insulating film 68, the barrier insulating film 29, the interlayer insulating film 28, and the liner insulating film 27 are removed by lithography process and etching process to form a source line contact (CS) plug 62 which extends onto the four adjacent source/drain diffusion layers 34.

In the semiconductor memory device of the fourth embodiment, the source line contact CS whose length X4 in the row direction is longer than fifth times as long as the minimum line width and shorter than sixth times as long as the same extends onto four adjacent source/drain diffusion layers 34. This structure can secure the fabrication margin of the source line contacts CS. Further, the space between the select gate lines SGS can be reduced to realize a smaller, more highly integrated and more easily fabricable memory cell array.

Fifth Embodiment

FIG. 22 schematically shows a plane pattern of the CS contact region in a nonvolatile semiconductor memory device according to a fifth embodiment of the invention.

As shown in FIG. 22, a structure of the semiconductor memory device of the fifth embodiment is the same as the corresponding one of the first embodiment (FIG. 6) except for the structure of the source line contacts CS. Two adjacent source line contacts CS in the semiconductor memory device of the fifth embodiment are shifted in the column direction.

A length X5 in the row direction of the source line contact CS is equal to the length in the row direction of each of the active regions AA1, AA2, AA3, ... AA8, .... A length Y5 in the column direction of the source line contact CS is equal to the length X5 in the column direction thereof. Accordingly, the source line contact CS of the fifth embodiment each takes a normal contact configuration defined by the lengths X5 and Y5, and are staggered. Specifically, adjacent source line contacts CS are shifted in the column direction by a distance which is shorter than the length in the row direction of the active regions AA1, AA2, AA3, ... AA8, ....

Forming rectangular (ditch) source line contacts CS is unnecessary and unnecessarily decrease fabrication margin due to a large shape difference between the normal square (hollow) contact and the rectangular thereof. Therefore, the source line contacts CS according to the semiconductor memory device of the fifth embodiment are shifted in the column direction by a distance which is shorter than the length in the row direction of the active regions AA1, AA2, AA3, ... AA8, ....

When the element separation regions STI and the active regions AA1, AA2, AA3, ... AA8, ... are arrayed in the line and space pattern of the minimum line width, the source line contact CS has the minimum size (X5, Y5), and adjacent source line contacts CS are mutually shifted in the column direction by a distance which is shorter than the length in the row direction of the active regions AA1, AA2, AA3, ... AA8, ....

(Cross Sectional Structure)

Figure 23:
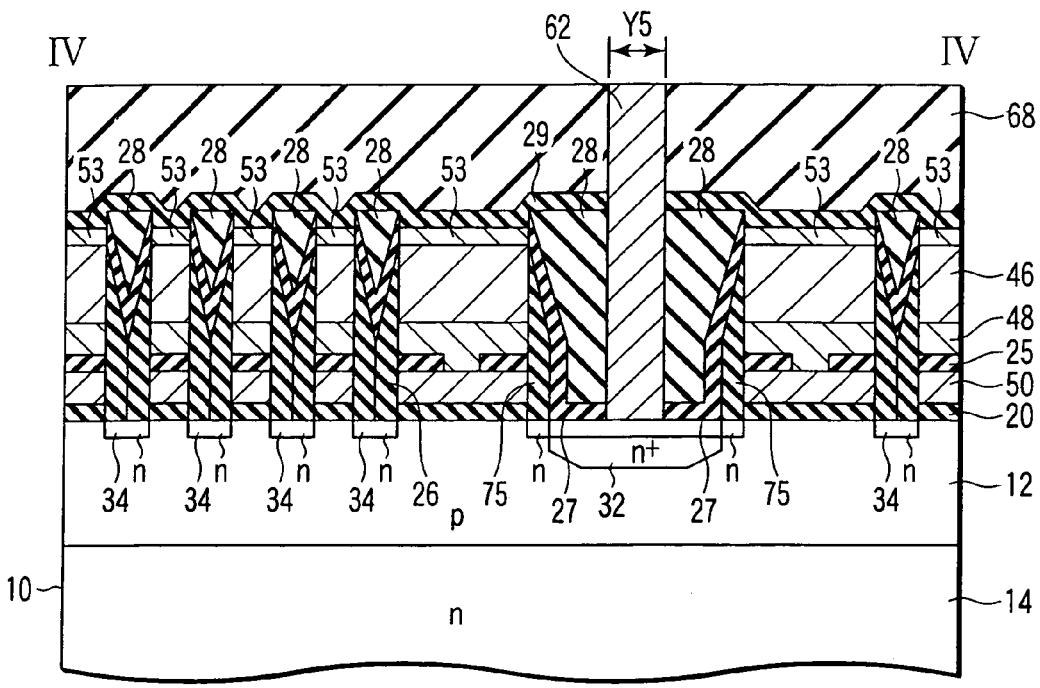
FIG. 23 schematically shows cross section along line IV-IV in FIG. 22.
Figure 24:
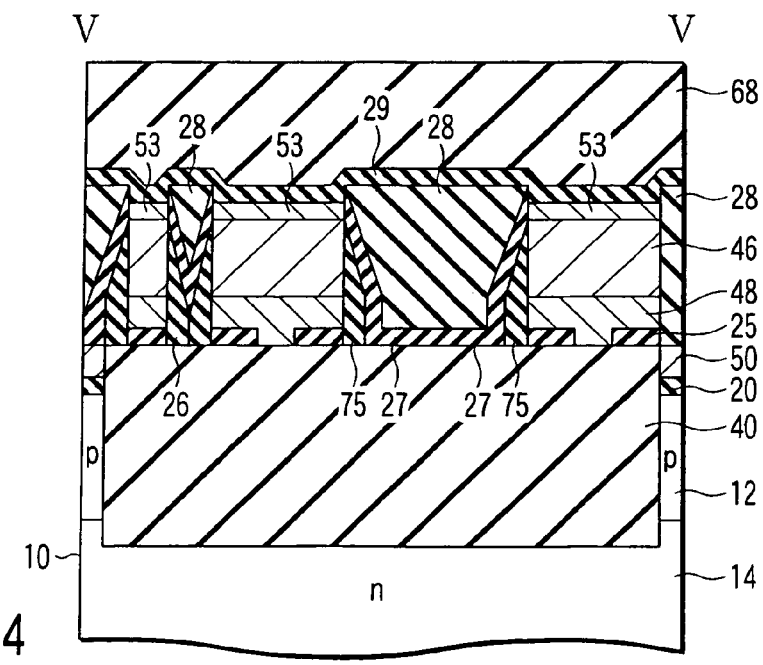
FIG. 24 schematically shows cross section along line V-V in FIG. 22.
Figure 25:
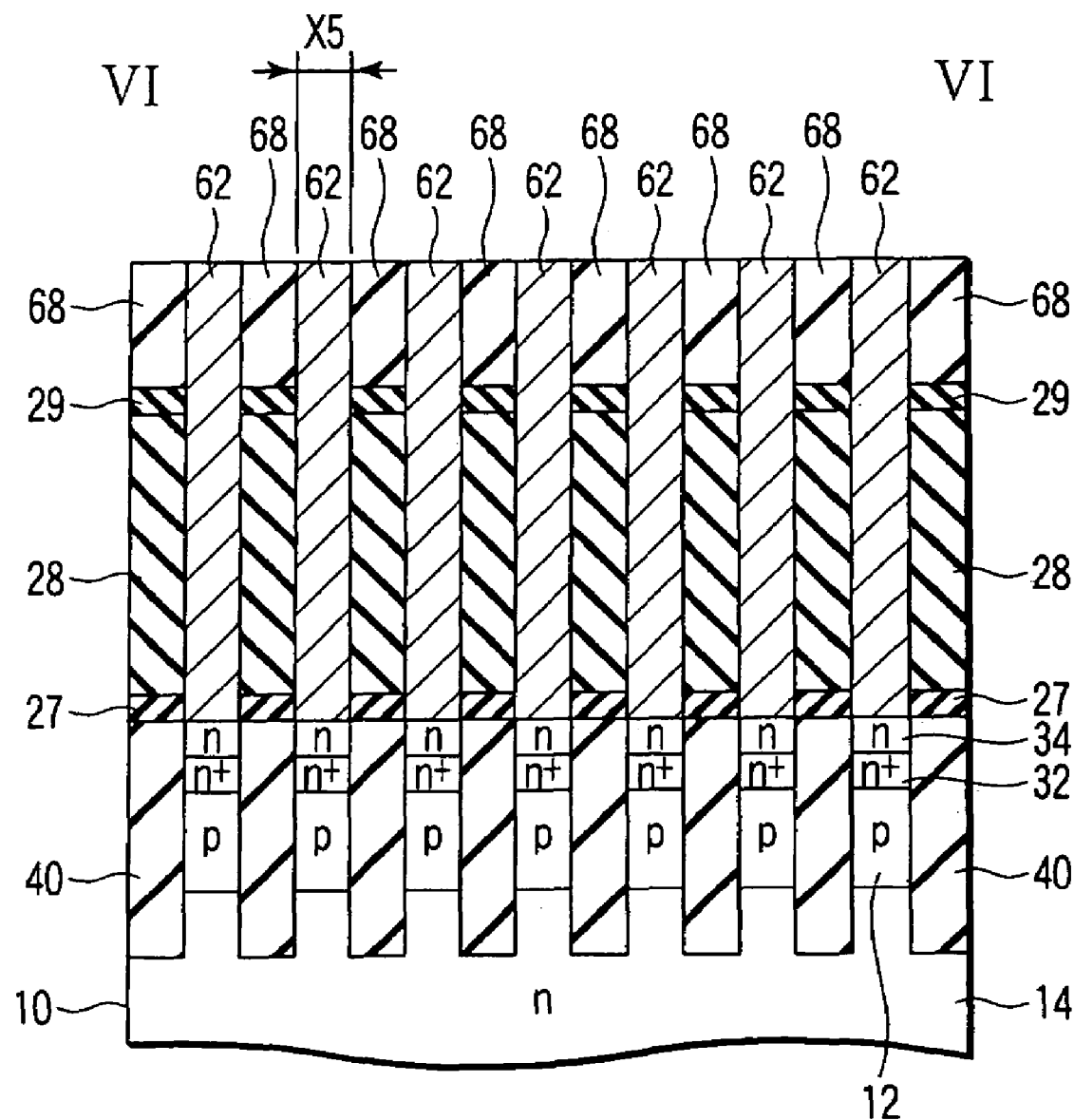
FIG. 25 schematically shows cross section along line VI-VI in FIG. 22.

FIGS. 23 to 25 show cross sectional structures of the source line contacts CS and their periphery in the semiconductor memory device of the fifth embodiment. FIG. 23 schematically shows a cross sectional structure along line IV-IV in FIG. 22. FIG. 24 schematically shows a cross sectional structure along line V-V in FIG. 22. FIG. 25 schematically shows a cross sectional structure along line VI-VI in FIG. 22. In FIG. 22, the line IV-IV extends in the column direction on the active region AA2. The line V-V extends in the column direction on the element separation region between the active regions AA3 and AA4. The line VI-VI extends in the row direction between the select gate lines SGD.

The memory cell transistors, the select gate transistors, and the bit line contacts CB in the semiconductor memory device of the fifth embodiment have substantially the same structures as those in the first embodiment. Accordingly, no further description is given here.

As shown in FIGS. 23 to 25, the source line contact CS in the semiconductor memory device of the fifth embodiment have the length X5 in the row direction of the minimum line width and is located on each source/drain diffusion layers 34. The interlayer insulating film 68, the barrier insulating film 29, the interlayer insulating film 28, and the liner insulating film 27 are removed by lithography process and etching process to form a source line contact (CS) plug 62 on the source/drain diffusion layers 34.

In the semiconductor memory device of the fifth embodiment, the source line contacts CS each of which has the length X5 equal to the minimum line width in the row direction are staggered on the source/drain diffusion layers 34 by a distance which is shorter than the length Y5 equal to the minimum line width. This structure can secure the fabrication margin of the source line contacts CS. Further, the space between the select gate lines SGS can be reduced to realize a smaller, more highly integrated and more easily fabricable memory cell array.

Sixth Embodiment

Figure 26:
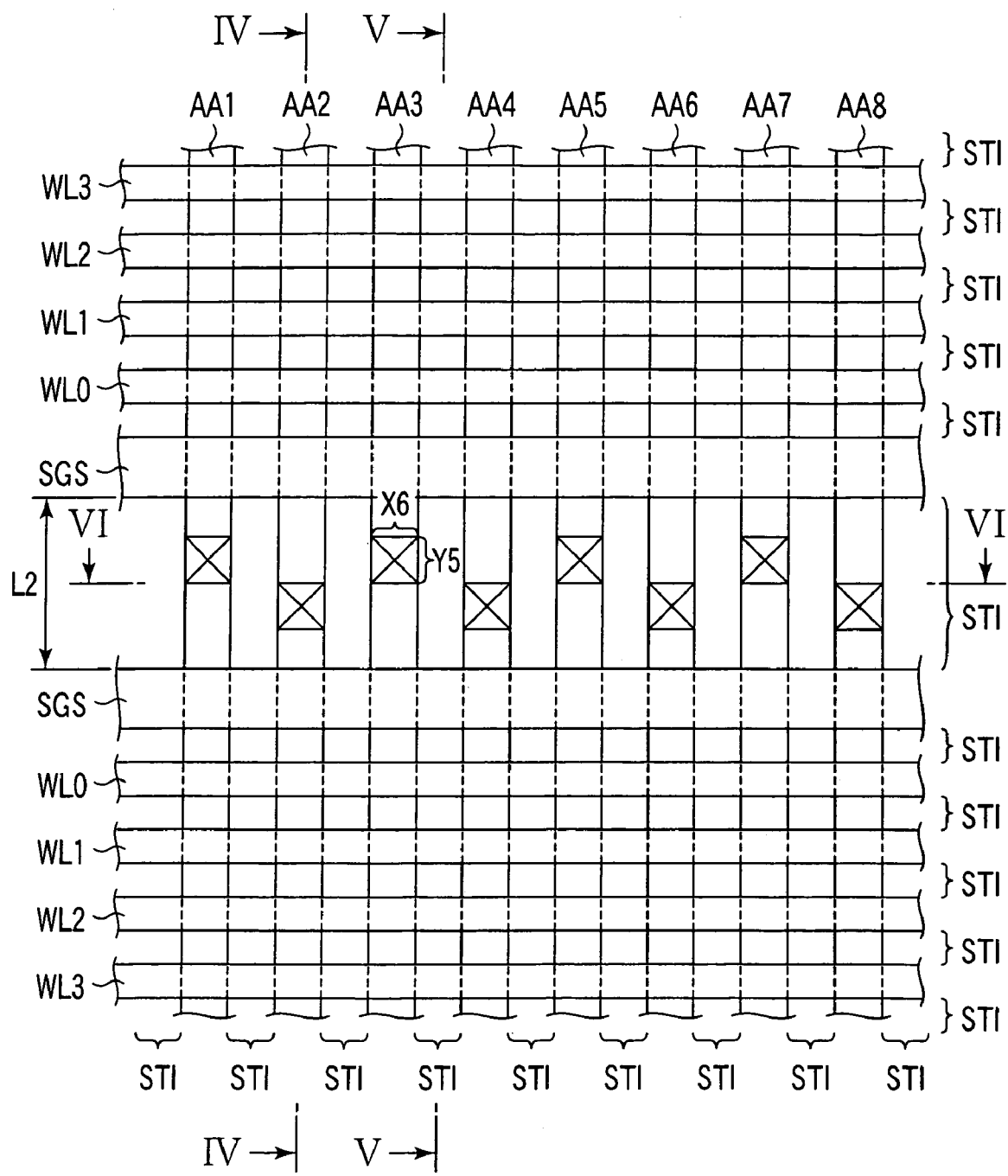
FIG. 26 schematically shows a plane pattern in an area around CS contacts of the nonvolatile semiconductor memory device according to a sixth embodiment.

FIG. 26 schematically shows a plane pattern of the CS contact region in a nonvolatile semiconductor memory device according to a sixth embodiment of the invention.

As shown in FIG. 26, a structure of the semiconductor memory device of the sixth embodiment is the same as the corresponding one of the first embodiment (FIG. 6) except for the structure of the source line contacts CS. Two adjacent source line contacts CS in the semiconductor memory device of the fifth embodiment are shifted in the column direction by a distance equal to the length in the row direction of each of the active regions AA1, AA2, AA3, . . . AA8, . . . .

A length X6 in the row direction of the source line contact CS is equal to the length in the row direction of each of the active regions AA1, AA2, AA3, . . . AA8, . . . . A length Y6 in the column direction of the source line contact CS is equal to the length X6 in the column direction thereof. Accordingly, the source line contact CS of the sixth embodiment each takes a normal contact configuration defined by the lengths X6 and Y6, and are staggered. Specifically, adjacent source line contacts CS are shifted in the column direction by a distance equal to the length in the row direction of the active regions AA1, AA2, AA3, . . . AA8, . . . .

Forming rectangular (ditch) source line contacts CS is unnecessary and unnecessarily decrease fabrication margin due to a large shape difference between the normal square (hollow) contact and the rectangular thereof. Therefore, the source line contacts CS according to the semiconductor memory device of the fifth embodiment are shifted in the column direction by a distance equal to the length in the row direction of the active regions AA1, AA2, AA3, . . . AA8, . . . .

When the element separation regions STI and the active regions AA1, AA2, AA3, . . . AA8, . . . are arrayed in the line and space pattern of the minimum line width, the source line contact CS has the minimum size (X5, Y5), and adjacent source line contacts CS are mutually shifted in the column direction by a distance Y6 (=X6) equal to the rowwise length of the active regions AA1, AA2, AA3, . . . AA8, . . . .

(Cross Sectional Structure)

Figure 27:
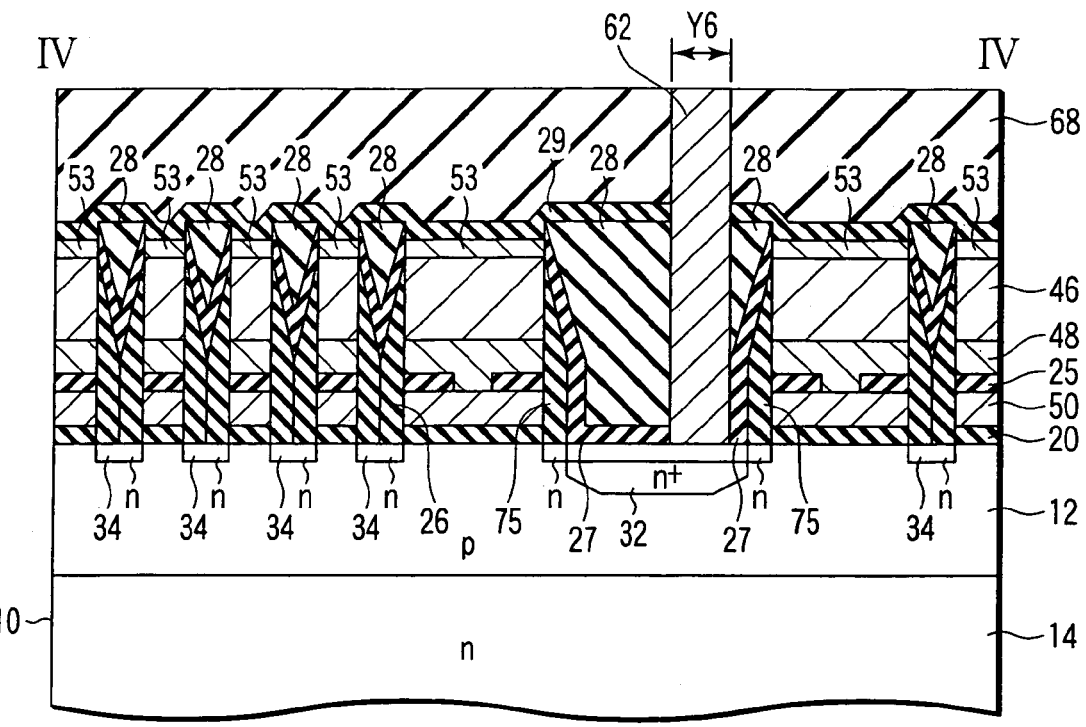
FIG. 27 schematically shows cross section along line IV-IV in FIG. 26.
Figure 28:
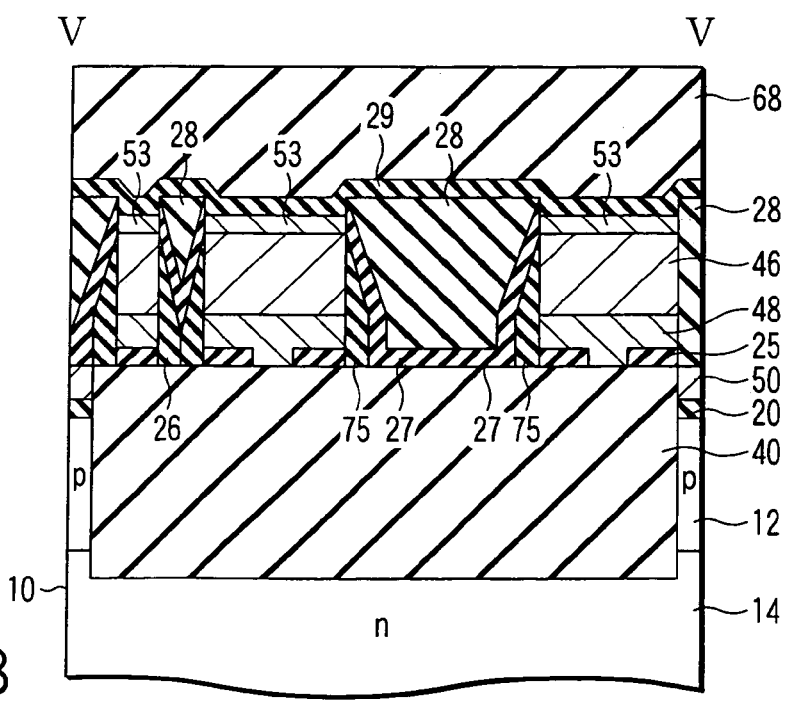
FIG. 28 schematically shows cross section along line V-V in FIG. 26.
Figure 29:
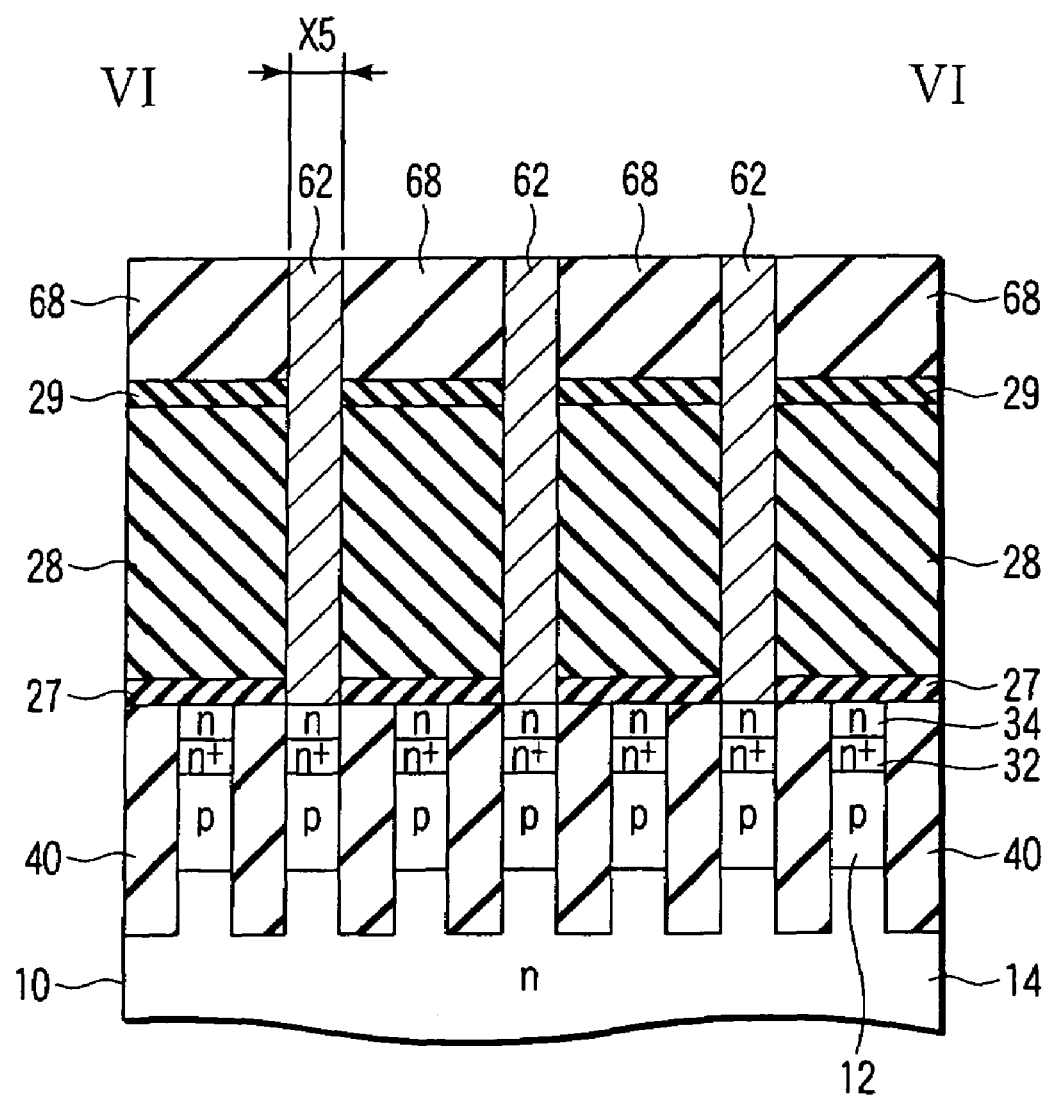
FIG. 29 schematically shows cross section along line VI-VI in FIG. 26.

FIGS. 27 to 29 show cross sectional structures of the source line contact CS and their periphery in the semiconductor memory device of the sixth embodiment. FIG. 27 schematically shows a cross sectional structure along line IV-IV in FIG. 26. FIG. 28 schematically shows a cross sectional structure along line V-V in FIG. 26. FIG. 29 schematically shows a cross sectional structure along line VI-VI in FIG. 26. In FIG. 26, the line IV-IV extends in the column direction on the active region AA2. The line V-V extends in the column direction on the element separation region between the active regions AA3 and AA4. The line VI-VI extends in the row direction between the select gate lines SGS.

The memory cell transistors, the select gate transistors, and the bit line contacts CB in the semiconductor memory device of the sixth embodiment have substantially the same structures as those in the first embodiment. Accordingly, no further description is given here.

As shown in FIGS. 27 to 29, the source line contact CS in the semiconductor memory device of the sixth embodiment have the length X6 in the row direction of the minimum line width and is located on each source/drain diffusion layers 34.

The interlayer insulating film 68, the barrier insulating film 29, the interlayer insulating film 28, and the liner insulating film 27 are removed by lithography process and etching process to form a source line contact (CS) plug 62 on the source/drain diffusion layers 34.

In the semiconductor memory device of the sixth embodiment, the source line contacts CS each of which has the length X6 equal to the minimum line width in the row direction are staggered on the source/drain diffusion layers 34 by a distance equal to the length Y6 equal to the minimum line width. This structure can secure the fabrication margin of the source line contacts CS. Further, the space between the select gate lines SGS can be reduced to realize a smaller, more highly integrated and more easily fabricable memory cell array.

(NAND Circuit Configuration)

Figure 30:
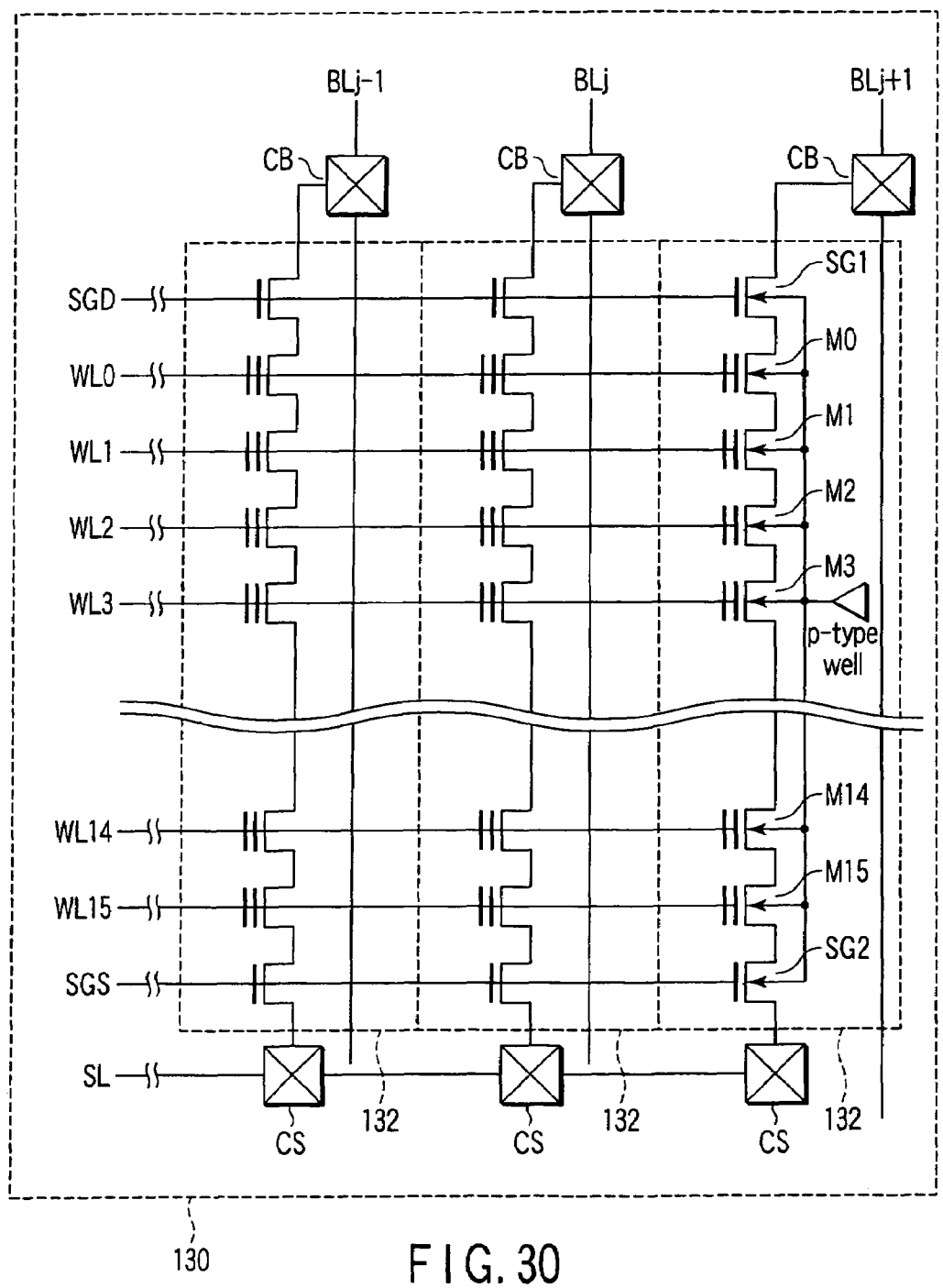
FIG. 30 is a schematic circuit diagram of a NAND memory cell array of the nonvolatile semiconductor memory device according to the first to sixth embodiments.

A memory cell array 130 of each of the semiconductor memory devices according to the first to sixth embodiments, as shown in FIG. 30, has the NAND memory cell array circuit configuration.

A NAND cell unit 132, as shown in FIG. 30, includes memory cell transistors M0 to M15 and select gate transistors SG1 and SG2. The drains of the select gate transistors SG1 are connected to bit lines $BL_{j-1}$, $BL_j$, $BL_{j+1}$, . . . through bit line contacts CB. The sources of the select gate transistors SG2 are connected to a common source line SL through the source line contacts CS.

The memory cell transistors M0 to M15 are connected in series in a direction in which the bit lines $BL_{j-1}$, $BL_j$, $BL_{j+1}$, . . . extend, through the source/drain regions of the memory cell transistors. The select gate transistors SG1 and SG2 are located at both ends of the serially-connected memory cell transistors M0 to M15. The select gate transistors SG1 and SG2 are connected to the bit line contacts CB and the source line contacts CS. As a result, one NAND cell unit 132 is formed. NAND cell units 132 are arranged in parallel in a direction in which word lines WL0, WL1, WL2, WL3, . . . WL14, WL15, orthogonal to the bit lines $BL_{j-1}$, $BL_j$, $BL_{j+1}$, . . . , extend.

In the semiconductor memory devices of the first to sixth embodiments, appropriately arranged source line contacts CS in the NAND flash memory can secure the fabrication margin and realize highly integrated and more easily fabricable memory cell array.

Seventh Embodiment

A memory cell array 130 in a semiconductor memory device according to a seventh embodiment of the present invention, as shown in FIG. 31, includes an AND memory cell array circuit configuration.

A block 134 designated by the dashed line in FIG. 31 is an AND cell unit. The AND cell unit 134, as shown in FIG. 31, includes memory cell transistors M0 to M15 connected in parallel and select gate transistors SG1 and SG2. The drains of the select gate transistors SG1 are connected to bit lines $BL_{j-1}$, $BL_j$, $BL_{j+1}$, . . . through the bit line contacts CB. The sources of the select gate transistors SG2 are connected to a common source line SL through source line contacts CS.

In the AND cell unit 134, the drain regions of the memory cell transistors M0 to M15 are mutually connected, and the source regions thereof are mutually connected. As shown in FIG. 31, in the AND cell unit 134, the memory cell transistors M0 to M15 are connected in parallel, one bit-line side select transistor SG1 is connected to one end of the connection, while one source-line side select transistor SG2 is connected to the other end of the connection. Word lines WL0 to WL15 are connected to the gates of the memory cell transistors M0 to M15, respectively. A select gate line SGD is connected to the gate of the bit-line side select transistor SG1. A select gate line SGS is connected to the gate of the source-line side select transistor SG2.

In the semiconductor memory device of the seventh embodiment, the configurations of the memory cell transistors, the select gate transistors, the bit line contacts CB, and the source line contacts CS, like the NAND circuit configuration, are substantially the same as those in any of the first to sixth embodiments.

According to the semiconductor memory device of the seventh embodiment, appropriately arranged source line contacts CS in the AND flash memory as in the first to sixth embodiments can realize highly integrated and more easily fabricable memory cell array.

Eighth Embodiment

Figure 32:
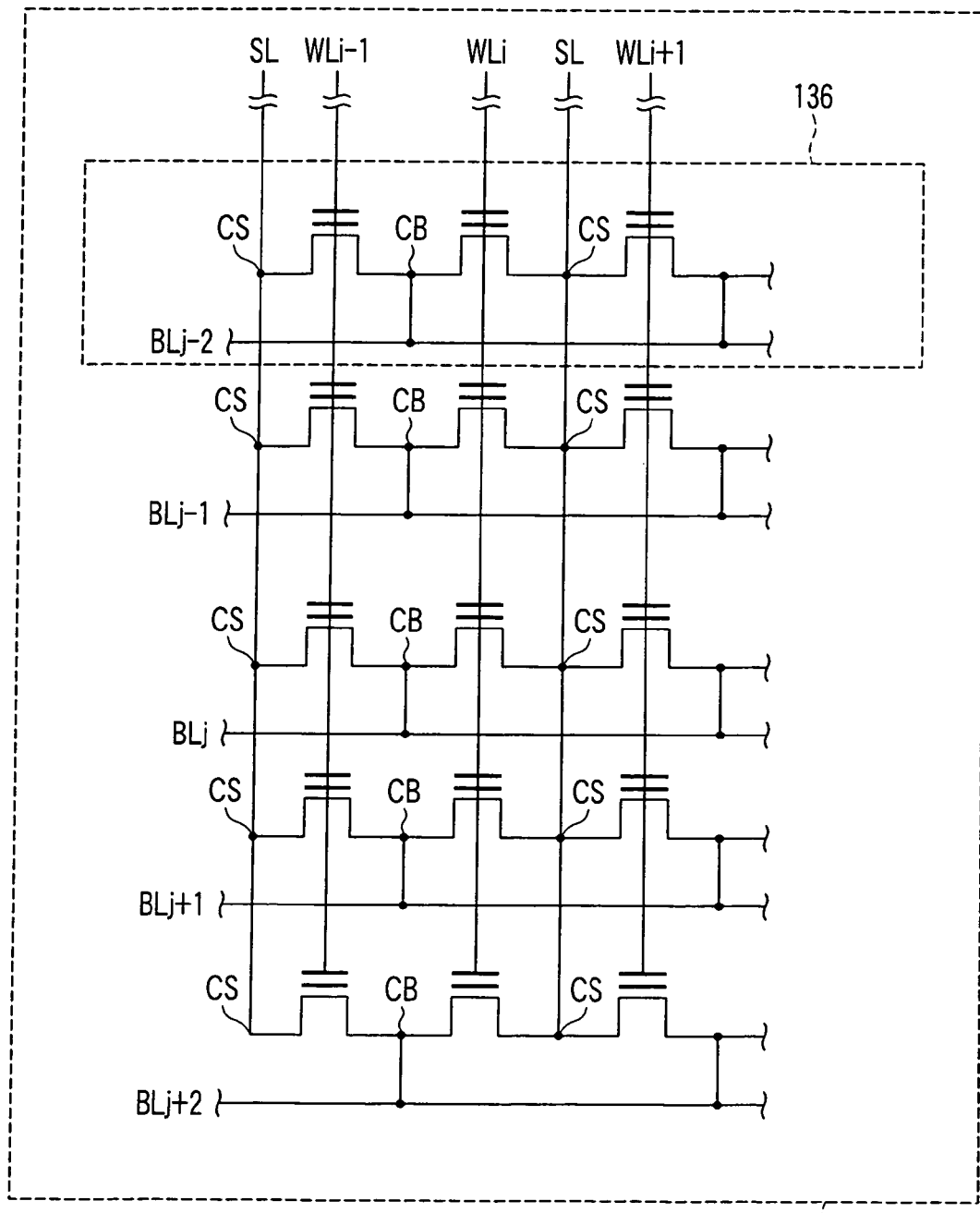
FIG. 32 is a schematic circuit diagram of a NOR memory cell array of a nonvolatile semiconductor memory device according to an eighth embodiment.

A memory cell array 130 in a semiconductor memory device according to an eighth embodiment of the present invention, as shown in FIG. 32, includes a NOR memory cell array circuit configuration.

A block 136 designated by the dashed line in FIG. 32 is a NOR cell unit 136.

In the NOR cell unit 136, a common source region of adjacent two memory cell transistors is connected to a source line SL through the source line contacts CS. A common drain region thereof is connected through bit line contacts CB to bit lines $BL_{j-2}, BL_{j-1}, BL_j, BL_{j+1}, BL_{j+2}, \ldots$. NOR cell units 136 are arrayed in the direction of word lines $WL_{i-1}, WL_i, WL_{i+1}, \ldots$, which are orthogonal to the bit lines $BL_{j-2}, BL_{j-1}, BL_j, BL_{j+1}, BL_{j+2}, \ldots$. The word lines $WL_{i-1}, WL_i, WL_{i+1}, \ldots$ are connected to the gate of the memory cell transistors between the NOR cell units 136. The semiconductor memory device with the NOR circuit configuration is higher than with the NAND circuit configuration in reading operation.

The semiconductor memory device of the eighth embodiment includes active regions AA1, AA2, AA3, ... AA8, ..., word lines WL0, WL1, WL2, ..., WLn, bit line contact CB, source line contact CS, and memory cell transistors.

Active regions AA1, AA2, AA3, ... AA8, ... are separated by element separation regions STI and extend in a column direction.

The word lines WL0, WL1, WL2, ..., WLn are orthogonal to the active regions AA1, AA2, AA3, ... AA8, ..., and extend in the row direction.

The memory cell transistors are located at intersections of the active regions AA1, AA2, AA3, ... AA8, ..., and the word lines WL0, WL1, WL2, ..., WLn.

The bit line contact CB is located between a pair of word lines WL0, WL1, WL2, ..., WLn.

The source line contact CS is located between another pair of word liens, which are adjacent to the pair of word lines just mentioned.

The source line contacts CS each contact with adjacent ones of active regions AA1, AA2, AA3, ... AA8, .... The source line contacts CS may take any of the forms in the first to sixth embodiments. Specifically, the source line contact CS may extend to adjacent two active regions of those active regions AA1, AA2, AA3, ... AA8, ... as in the first embodiment. Alternatively, the length X1 in the row direction of the source line contact CS may be two times as long as the length in the row direction of the active regions AA1, AA2, AA3, ... AA8, ... as in the second embodiment. Further, the source line contacts CS may be staggered in the column direction as in the fifth embodiment. Embodiments other than those just mentioned may be applied to the source line contacts.

The memory cell transistors, the select gate transistors, and the bit line contacts CB have the same structures as those in the first to sixth embodiments.

In the semiconductor memory device of the eighth embodiment, appropriately arranged source line contacts CS in the NOR flash memory as in the first to sixth embodiments can realize highly integrated and more easily fabricable memory cell array.

Ninth Embodiment

Figure 33:
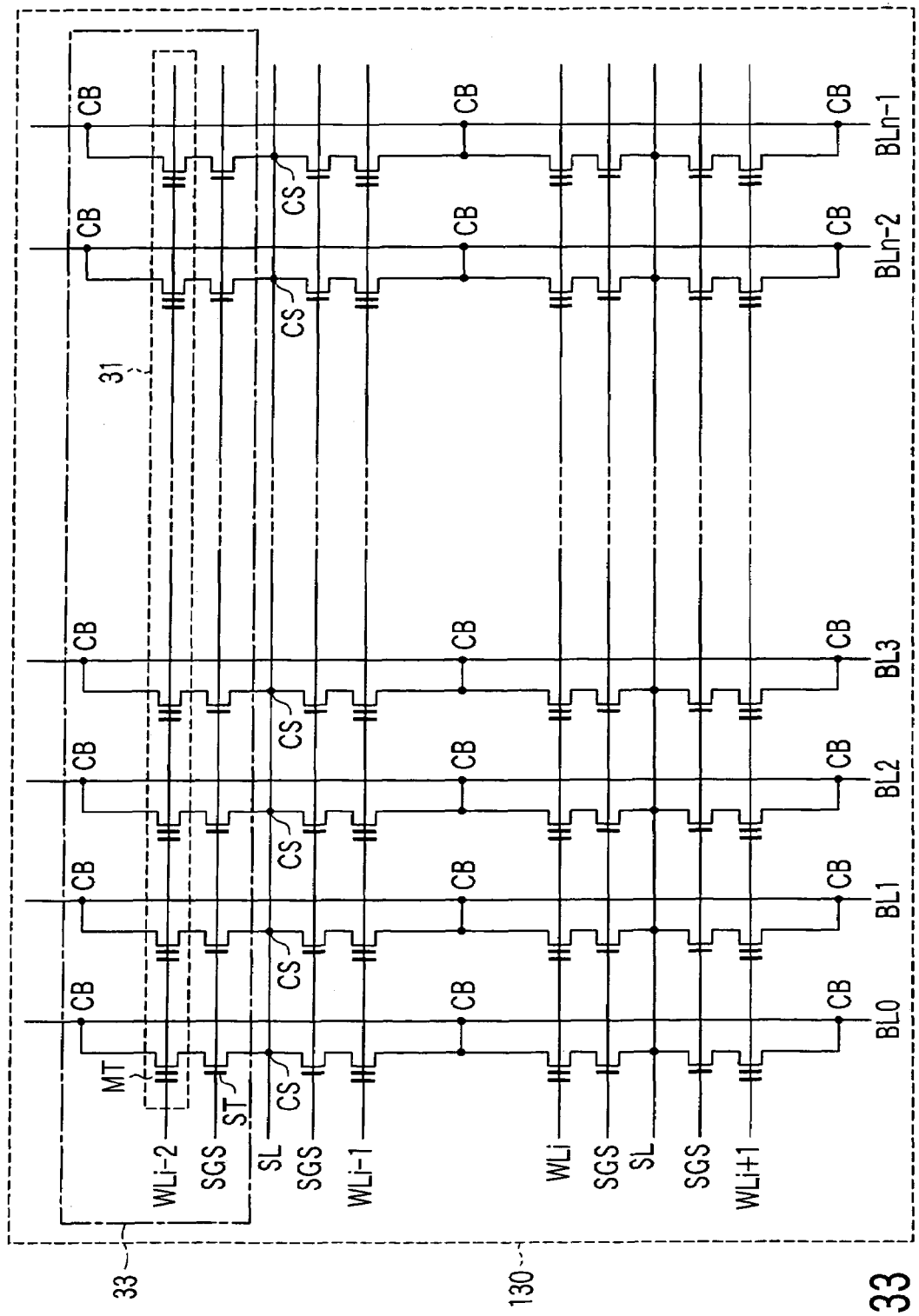
FIG. 33 is a schematic circuit diagram of a 2-transistor/cell memory cell array of a nonvolatile semiconductor memory device according to a ninth embodiment.

A memory cell array 130 in a semiconductor memory device according to a ninth embodiment of the present invention, as shown in FIG. 33, includes a 2-transistor/cell memory cell array circuit configuration.

The semiconductor memory device of the ninth embodiment is based on a 2-transistor/cell memory cell array structure, and includes memory cell transistors MT having the stack gate structure. The drain region of the memory cell transistor MT is connected to the bit line contact CB, and its source region is connected to the drain region of a select transistor ST. The source region of the select transistor ST is connected to the source line contact CS. The memory cells of the 2-transistor/cell type are arrayed in parallel in the word line direction to thereby form a memory cell block 33.

Within one memory cell block 33, the word line $WL_{i-2}$ is connected to the control gate electrode layers of memory cell transistors MT. Memory cell transistors which share one word line form one page 31. The pages in more than one blocks may be grouped into one page. A select gate line SGS is connected to the gate electrodes of select transistors ST.

In the direction in which the bit lines BL0, BL1 BL2, ..., BLn−1 extend, the memory cell transistors of the 2-transistor/cell type are line-symmetrically arrayed in series with respect to each source line SL.

The semiconductor memory device of the ninth embodiment includes active regions AA1, AA2, AA3, ... AA8, ..., word lines WL0, WL1, WL2, ... WLn, bit line contacts CB, a pair of source-line side select gate lines SGS, memory cell transistors MT, select transistors ST, and source line contact CS.

The active regions AA1, AA2, AA3, ... AA8, ... are separated by the element separation regions STI and extend in the column direction.

The word lines WL0, WL1, WL2, ... WLn are orthogonal to the active regions AA1, AA2, AA3, ... AA8, ..., and extend in the row direction.

The bit line contact CB are each located between each pair of the word lines WL0, WL1, WL2, ... WLn.

The pair of source-line side select gate lines SGS are located between another pair of word lines WL0, WL1, WL2, ... WLn, which is different from the pair which sandwich the bit line contact, and are arranged in parallel with the word line group.

The memory cell transistors MT each are located at the intersections of the active regions AA1, AA2, AA3, ... AA8, ... and the word lines WL0, WL1, WL2, ... WLn.

The select transistors ST are respectively located at the intersections of the active regions AA1, AA2, AA3, ... AA8, ... and the source-line side select gate lines SGS.

The source line contact CS is located between the pair of source-line side select gate lines SGS, and in contact with adjacent ones of active regions AA1, AA2, AA3, ... AA8, ....

The source line contacts CS may take any of the forms in the first to sixth embodiments, as stated in the eighth embodiment.

The memory cell transistors, the select gate transistors, and the bit line contacts CB have the same structures as those in the first to sixth embodiments.

In the semiconductor memory device of the ninth embodiment, appropriately arranged source line contacts CS in the 2-transistor/cell type flash memory as in the first to sixth embodiments can realize highly integrated and more easily fabricable memory cell array.

Tenth Embodiment

Figure 34:
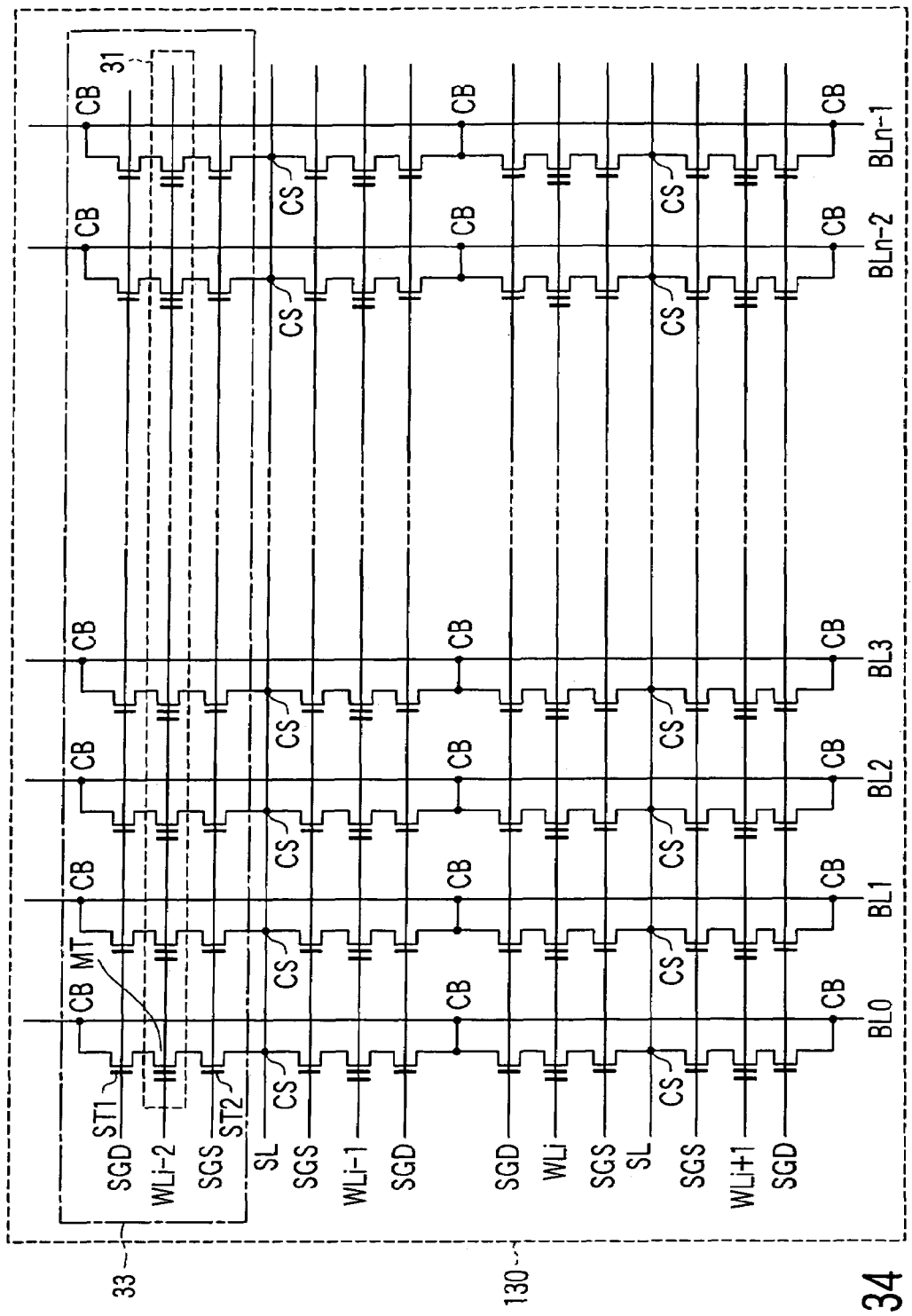
FIG. 34 is a schematic circuit diagram of a 3-transistor/cell memory cell array of a nonvolatile semiconductor memory device according to a tenth embodiment.

A memory cell array 130 in a semiconductor memory device according to a tenth embodiment of the present invention, as shown in FIG. 34, includes a 3-transistor/cell memory cell array circuit configuration.

The semiconductor memory device of the tenth embodiment is based on a 3-transistor/cell type structure, and includes memory cell transistors MT having the stack gate structure. Select transistors ST1 and ST2 are located at both sides of the memory cell transistors MT. The drain region of the memory cell transistor MT is connected to the bit line contact CB through the bit-line side select transistor ST1, and its source region is connected to the source line contact CS through the source-line side select transistor ST2. The memory cells of the 3-transistor/cell type are arrayed in parallel in the word line direction to thereby form a memory cell block 33.

Within one memory cell block 33, the word line $WL_{i-2}$ is connected to the control gate electrode layers of memory cell transistors MT. Memory cell transistors which share one word line form one page 31. The pages in more than one blocks may be grouped into one page.

A select gate line SGS is connected to the gate electrodes of source-line side select transistors ST2. A select gate line SGD is connected to the gate electrodes of bit-line side select transistors ST1.

In the direction in which the bit lines BL0, BL1 BL2, ..., BLn−1 extend, the memory cell transistors of the 3-transistor/cell type are line-symmetrically arranged in series with respect to each source line SL.

The semiconductor memory device of the tenth embodiment can operate like a cross between the NAND and NOR circuits.

The semiconductor memory device of the tenth embodiment includes active regions AA1, AA2, AA3, ... AA8, ..., word lines WL0, WL1, WL2, ... WLn, a pair of bit-line side select gate lines SGD, a pair of source-line side select gate lines SGS, memory cell transistors MT, select transistors ST1 and ST2, bit line contact CB, and source line contact CS.

The active regions AA1, AA2, AA3, ... AA8, ... are separated by the element separation regions STI and extend in the column direction.

The word lines WL0, WL1, WL2, ... WLn are orthogonal to the active regions AA1, AA2, AA3, ... AA8, ..., and extend in the row direction.

The pair of bit-line side select gate lines SGD are located between a pair of word lines WL0, WL1, WL2, ... WLn, and are arranged in parallel with the word lines WL0, WL1, WL2, ... WLn.

The pair of source-line side select gate lines SGS are located between another pair of word lines WL0, WL1, WL2, ... WLn, which is different from the pair which sandwich the bit-line side select gate lines SGD, and are arranged in parallel with the word lines.

The memory cell transistors MT each are located at the intersections of the active regions AA1, AA2, AA3, ... AA8, ... and the word lines WL0, WL1, WL2, ... WLn.

The select transistors ST1 and ST2 each are located at the intersections of the active regions AA1, AA2, AA3, ... AA8, ... and the select gate lines SGD and SGS.

The bit line contact CB is located between the pair of bit-line side select gate lines SGD.

The source line contact CS is located between the pair of source-line side select gate lines SGS to be in contact with adjacent active regions.

The source line contacts CS may take any of the forms in the first to sixth embodiments, as stated in the eighth embodiment.

The memory cell transistors, the select gate transistors, and the bit line contacts CB have the same structures as those in the first to sixth embodiments.

In the semiconductor memory device of the tenth embodiment, appropriately arranged source line contacts CS in the 3-transistor/cell type flash memory as in the first to sixth embodiments can realize highly integrated and more easily fabricable memory cell array.

Applications

The operation of the semiconductor memory device according to the embodiment of the present invention comes in three categories; a page mode, a byte mode and an EEPROM mode having a ROM region.

In the page mode, data is read out in batch from the memory cells on one word line in the flash memory cell array to the sense amplifier through the bit lines and data is written in batch into the memory cells from the sense amplifier. In other words, data is read from and written into the memory cells in units of page.

In the byte mode, data is read out from the memory cells on one word line in the flash memory cell array in units of byte to the sense amplifier and data is written into the memory cells in units of byte from the sense amplifier. The byte mode is different from the page mode in that the data is read and written in units of byte.

In the EEPROM mode having a ROM region, the flash memory cell array is divided into a flash memory part and an EEPROM part having a ROM region. The EEPROM part having a ROM region is switched to operate to read and write data from and into the flash memory cell array in units of page or byte.

The semiconductor memory devices of the first to tenth embodiments can also be operated in the page mode, the byte mode or the EEPROM mode having a ROM region.

The semiconductor memory devices of the first to tenth embodiments have many applications. Some specific examples of the applications will be described with reference to FIGS. 35 to 49.

(Application 1)

FIG. 35 is a schematic block diagram showing major elements of a flash memory device and system. As shown in FIG. 35, a flash memory system 142 is made up of a host platform 144 and a universal serial bus (USB) flash device 146.

The host platform 144 is connected through a USB cable 148 to the USB flash device 146. The host platform 144 is connected to the USB cable 148 through a USB host connector 150, and the USB flash device 146 is connected to the USB cable 148 through a USB flash device connector 152. The host platform 144 includes a USB host controller 154 for controlling packet transfer on a USB bus.

The USB flash device 146 controls other components than the USB flash device 146 per se. The USB flash device 146 includes a USB flash device controller 156, a USB flash device connector 152, and at least one flash memory module 158 which is constructed with any of the semiconductor memory devices of the first to tenth embodiments. The USB flash device controller 156 controls an interface to the USB bus of the USB flash device 146.

Upon connection of the USB flash device 146 to the host platform 144, a standard USB enumeration process starts. In this process, the host platform 144 recognizes the USB flash device 146, selects a communication mode with the USB flash device 146, and sends and receives data to and from the USB flash device 146 through an FIFO buffer which stores transfer data and is called an end point. The host platform 144 uses another end point to recognize physical and electrical states when the USB flash device 146 is attached and detached, and receives, if any, packets.

The host platform 144 sends a request packet to the USB host controller 154 to ask the USB flash device 146 to provide a service. The USB host controller 154 transmits a packet to the USB cable 148. If the USB flash device 146 has an end point having accepted this request packet, these requests are received by the USB flash device controller 156.

The USB flash device controller 156, for example, reads and writes data from and to the flash memory module 158, and erases data in the flash memory module 158. Further, it supports basic functions, for example, of acquiring the USB address.

The USB flash device controller 156 controls the flash memory module 158 with a control line 160 for controlling the output from the flash memory module 158, and with various signals, e.g., chip enable signal CE, or read/write signal.

The flash memory module 158 is also connected to the USB flash device controller 156 with an address data bus 162. The address data bus 162 transfers commands of reading and writing data from and to the flash memory module 158 or erasing the data, and transfers address and data of the flash memory module 158.

The USB flash device 146 uses a status end point (end point 0) to send state packet in order to notify the host platform 144 of the results of various operations requested by the host platform 144 and status. In this process, the host platform 144 checks presence of a status packet (polling), and the USB flash device 146 returns an empty packet when a packet of a new status message is nor present, or the status packet per se.

Thus, various functions of the USB flash device 146 can be realized. The USB cable 148 may be omitted to directly connect their connectors.

(Memory Card)

(Application 2)

As an example, a memory card 260 including a semiconductor memory device 250 is configured as shown in FIG. 36. Any of the semiconductor memory devices of the first to tenth embodiments may be applied to the semiconductor memory device 250. The memory card 260, as shown in FIG. 36, receives and outputs signals from and to an external device (not shown).

A signal line DAT, a command line enable signal line CLE, an address line enable signal line ALE, and a ready/busy signal line R/B are connected to the memory card 260 incorporating the semiconductor memory device 250. The signal line DAT transfers data signals, address signals and command signals. The command line enable signal line CLE transmits a signal indicating that a command signal is on the signal line DAT. The address line enable signal line ALE transmits a signal indicating that an address signal is on the signal line DAT. The ready/busy signal line R/B transmits a signal indicating that the semiconductor memory device 250 is ready or not.

(Application 3)

Another example of the memory card 260 is shown in FIG. 37. The memory card includes a controller 276 in addition to the semiconductor memory device 250. The controller 276 controls the semiconductor memory device 250 and sends and receives signals to and from an external device.

The controller 276 includes interface units (I/F) 271 and 272, a microprocessor unit (MPU) 273, a buffer RAM 274, and an error correction code unit (ECC) 275 contained in the interface unit 272.

The interface unit 271 sends and receives signals to and from the external device. The interface unit 272 sends and receives signals to and from the semiconductor memory device 250. The microprocessor unit 273 converts logical addresses into physical addresses. The buffer RAM 274 temporarily stores data. The error correction code unit 275 generates error correction codes.

A command signal line CMD, a clock signal line CLK, and the signal line DAT are connected to the memory card 260. The number of control signal lines, the bit width of the signal line DAT, and the circuit configuration of the controller 276 may be modified.

(Application 4)

Figure 38:
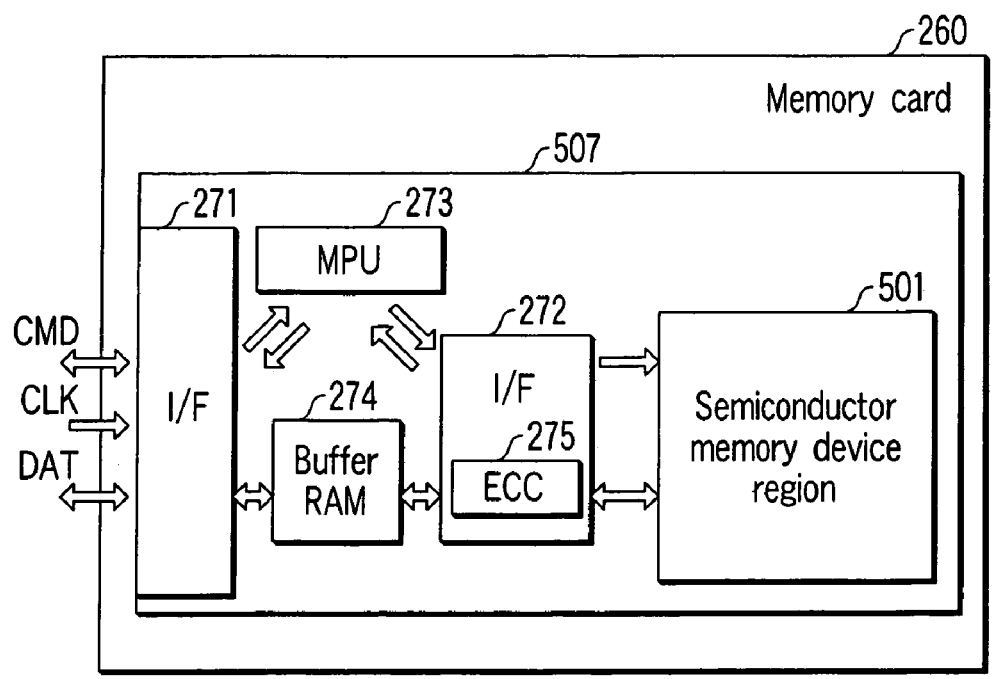

In another example of the configuration of the memory card 260, as shown in FIG. 38, the interface units 271 and 272, the microprocessor unit 273, the buffer RAM 274, the error correction code unit 275 contained in the interface unit 272, and a semiconductor memory device region 501 are all integrated into one chip as a system LSI chip 507. Such a system LSI chip 507 is contained in the memory card 260.

(Application 5)

Figure 39:
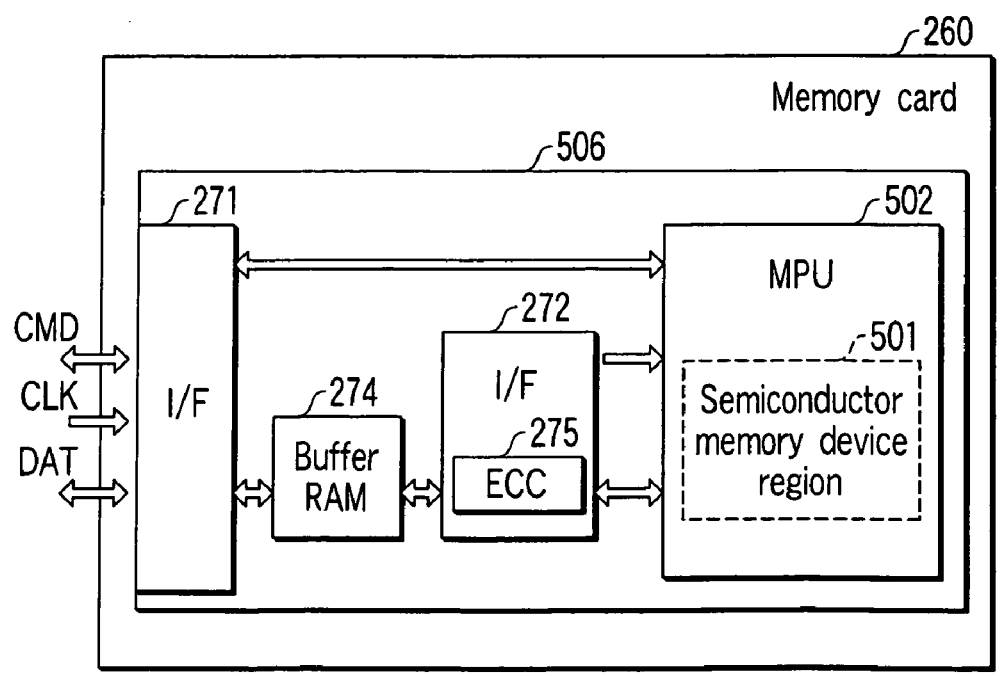

A further example of the configuration of the memory card 260 is shown in FIG. 39. As shown, the semiconductor memory device region 501 is formed in the microprocessor unit 273 thereby to form a memory embedded MPU 502. Further, the microprocessor unit 273, the interface units 271 and 272, the buffer RAM 274, and the error correction code unit 275 contained in the interface unit 272 are all integrated into one chip to form a system LSI chip 506. Such a system LSI chip 506 is contained in the memory card 260.

(Application 6)

Figure 40:
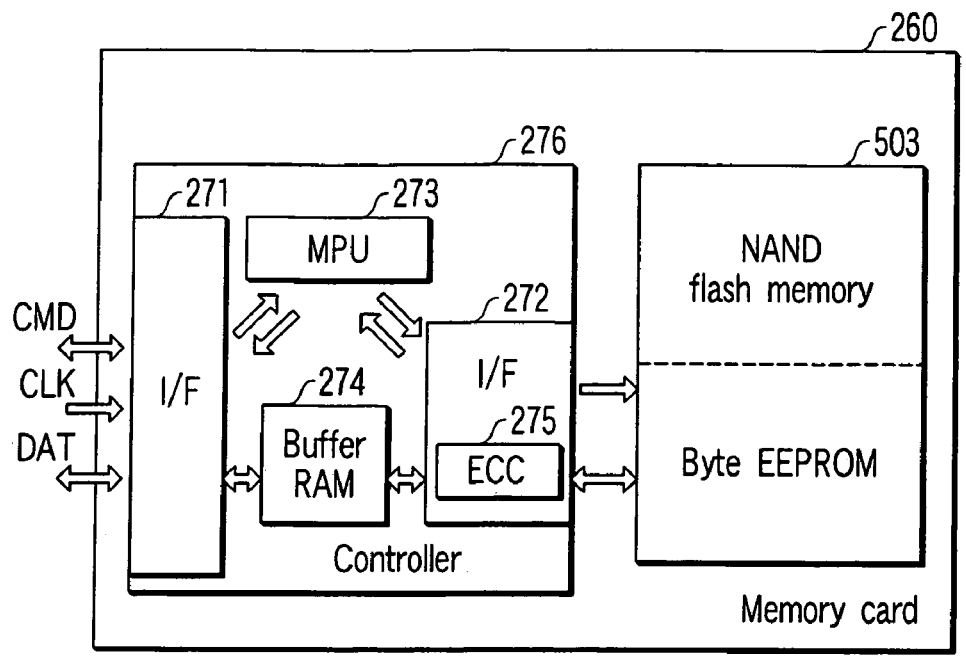

Another example of the memory card 260 is shown in FIG. 40. As shown, this memory card uses a flash memory 503 in place of the semiconductor memory device 250 shown in FIG. 36 or 37. The flash memory 503 operates in the EEPROM mode having a ROM region, which is formed by a NAND flash memory and a byte type EEPROM.

The flash memory 503 may be formed in the chip containing the controller 276 to form a one-chip system LSI chip 507 as in the case of FIG. 38.

As in the case of FIG. 39, a semiconductor memory region containing the flash memory 503 may be formed in the microprocessor unit 273 to form a memory embedded MPU 502 to form a system LSI chip 506 which contains integrated MPU 502, the interface units 271 and 272, and the buffer RAM 274.

(Application 7)

Figure 41:
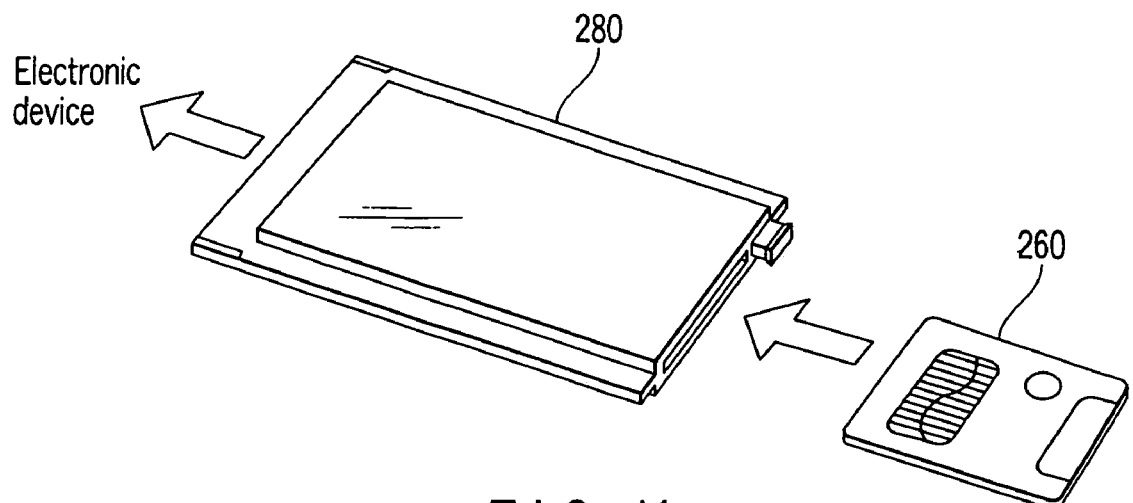
FIG. 41 is a view schematically showing a memory card and a card holder to which the nonvolatile semiconductor memory device according to the first to tenth embodiments is applied.

An application of each of the memory cards 260 shown in FIGS. 36 to 40 may be a memory card holder 280, as shown in FIG. 41. The memory card holder 280 can contain the memory card 260. The memory card 260 contains any of the semiconductor memory devices of the first to tenth embodiments as the semiconductor memory device 250. The memory card holder 280 is connected to an electronic device (not shown), and is operable as an interface between the memory card 260 and the electronic device. The memory card holder 280 may execute various functions, including the functions of the controller 276, the microprocessor unit 273, the buffer RAM 274, the error correction code unit 275, and the interface units 271 and 272, which are contained in the memory cards 260 shown in FIGS. 36 to 40.

(Application 8)

Another application will be described with reference to FIG. 42. In FIG. 42, there is shown a connection device 290 capable of containing the memory card 260 or the memory card holder 280. The memory card 260 or the memory card holder 280 contains any of the semiconductor memory devices of the first to sixth embodiments as the semiconductor memory device 250 or the semiconductor memory device region 501, or the memory embedded MPU 502, or the flash memory 503 operating in the EEPROM mode having a ROM region.

The memory card 260 or the memory card holder 280 is attached and electrically connected to the connection device 290. The connection device 290 is connected to a circuit board 291 including a CPU 294 and a bus 295, with a connection wire 292 and an interface circuit 293.

(Application 9)

Additional application will be described with reference to FIG. 43. FIG. 43 describes that the connection device 290 of the application 8 is connected to a personal computer (PC) 350 in place of the interface circuit 293 with a connection wire.

(Application 10)

Another application will be described with reference to FIG. 44. FIG. 44 shows that the memory card 260 of the application 8 is inserted into a digital camera 650 containing the memory card holder 280.

(IC Card)

(Application 11)

A yet another application of each of the semiconductor memory devices of the first to tenth embodiments, as shown in FIGS. 45 and 46, is an interface circuit (IC) card 500 including an MPU 400, which contains a semiconductor memory device 250, a ROM 410, a RAM 420, and a CPU 430, and a plane terminal 600.

The IC card 500 may be connected to an external device through the plane terminal 600. The plane terminal 600 is connected to the MPU 400 in the IC card 500. The CPU 430 includes a computing part 431 and a control part 432. The control part 432 is connected to the semiconductor memory device 250, the ROM 410, and the RAM 420. The MPU 400 is desirably molded on one of the surfaces of the IC card 500, and the plane terminal 600 is formed on the other surface of the IC card 500.

Any of the semiconductor memory devices of the first to tenth embodiments may be applied to the semiconductor memory device 250 or the ROM 410. The semiconductor memory device can operate in the page mode, the byte mode or a pseudo EEPROM mode.

(Application 12)

Figure 47:
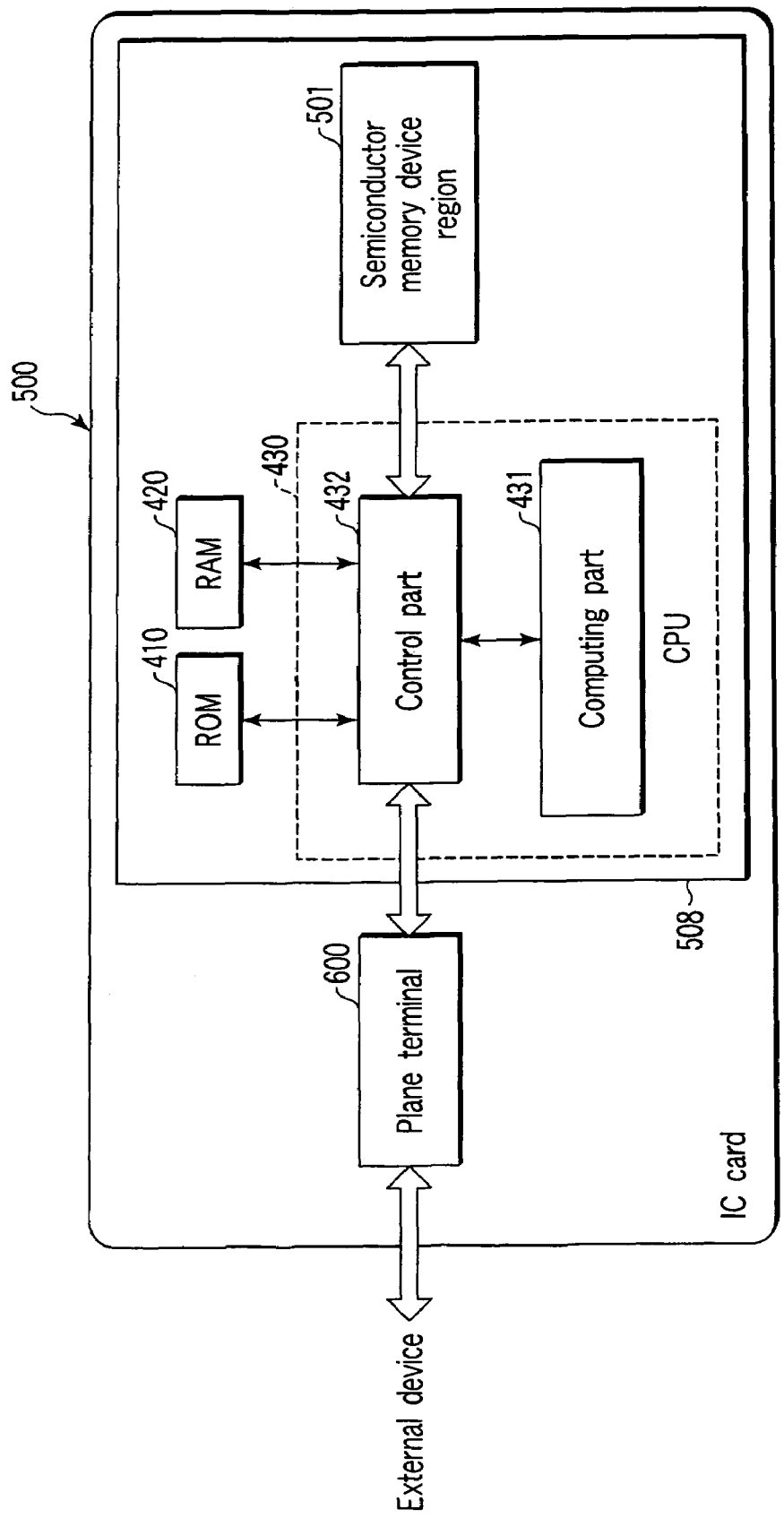

In another example of the IC card 500, as shown in FIG. 47, the ROM 410, the RAM 420, the CPU 430, and the semiconductor memory device region 501 are all integrated into one chip as a system LSI chip 508. Such a system LSI chip 508 is contained in the IC card 500.

Any of the semiconductor memory devices of the first to tenth embodiments may be applied to the semiconductor memory device region 501 and the ROM 410. The semiconductor memory device can operate in the page mode, the byte mode or the pseudo EEPROM mode.

(Application 13)

Figure 48:
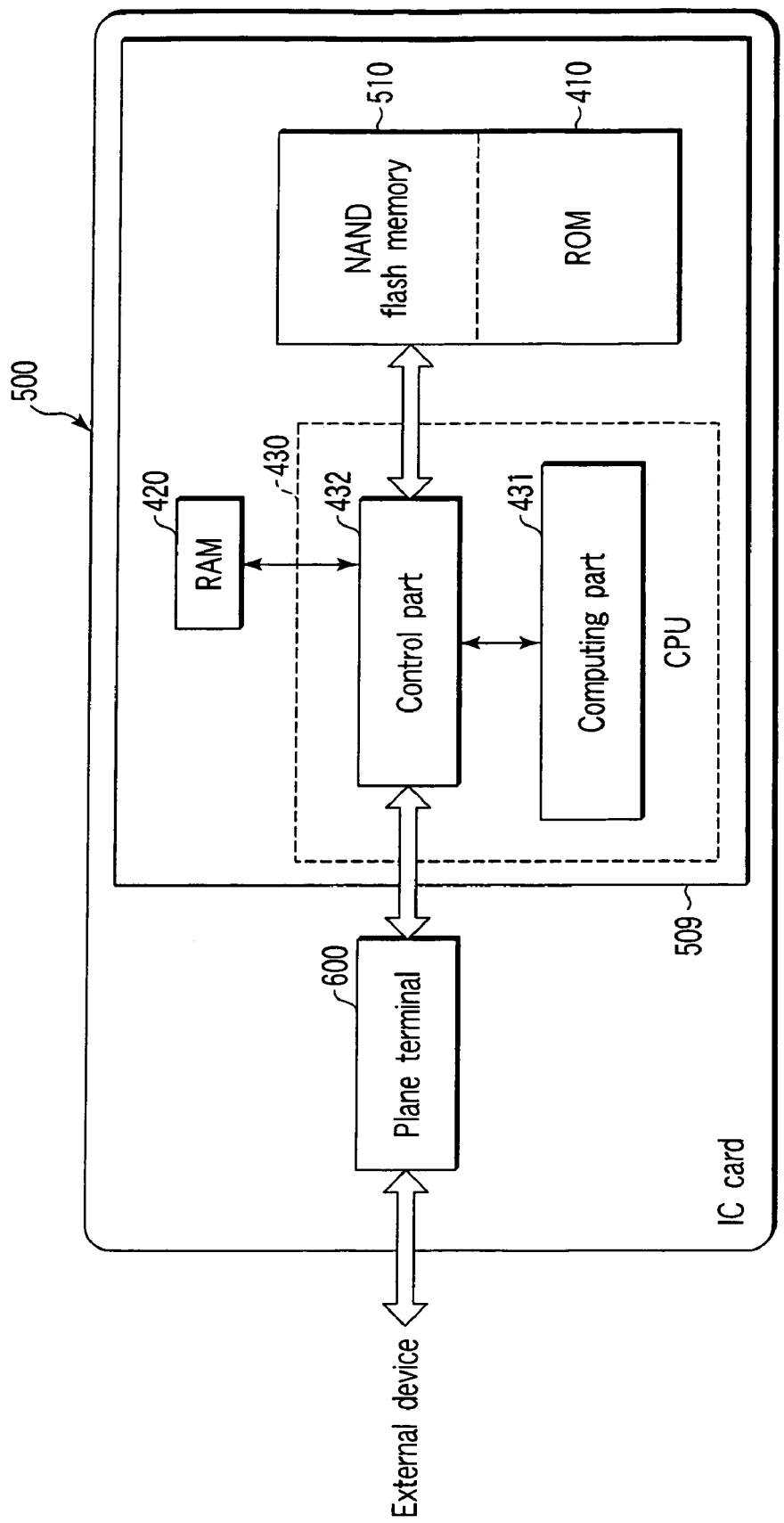

In yet another example of the IC card 500, as shown in FIG. 48, the ROM 410 is incorporated into the semiconductor memory device region 501 to thereby form a flash memory 510 which can operate in the EEPROM mode having a ROM region, as a whole.

Further, the flash memory 510, the RAM 420, and the CPU 430 are all integrated into one chip as a system LSI chip 509. Such a system LSI chip 509 is contained in the IC card 500.

(Application 14)

Figure 49:
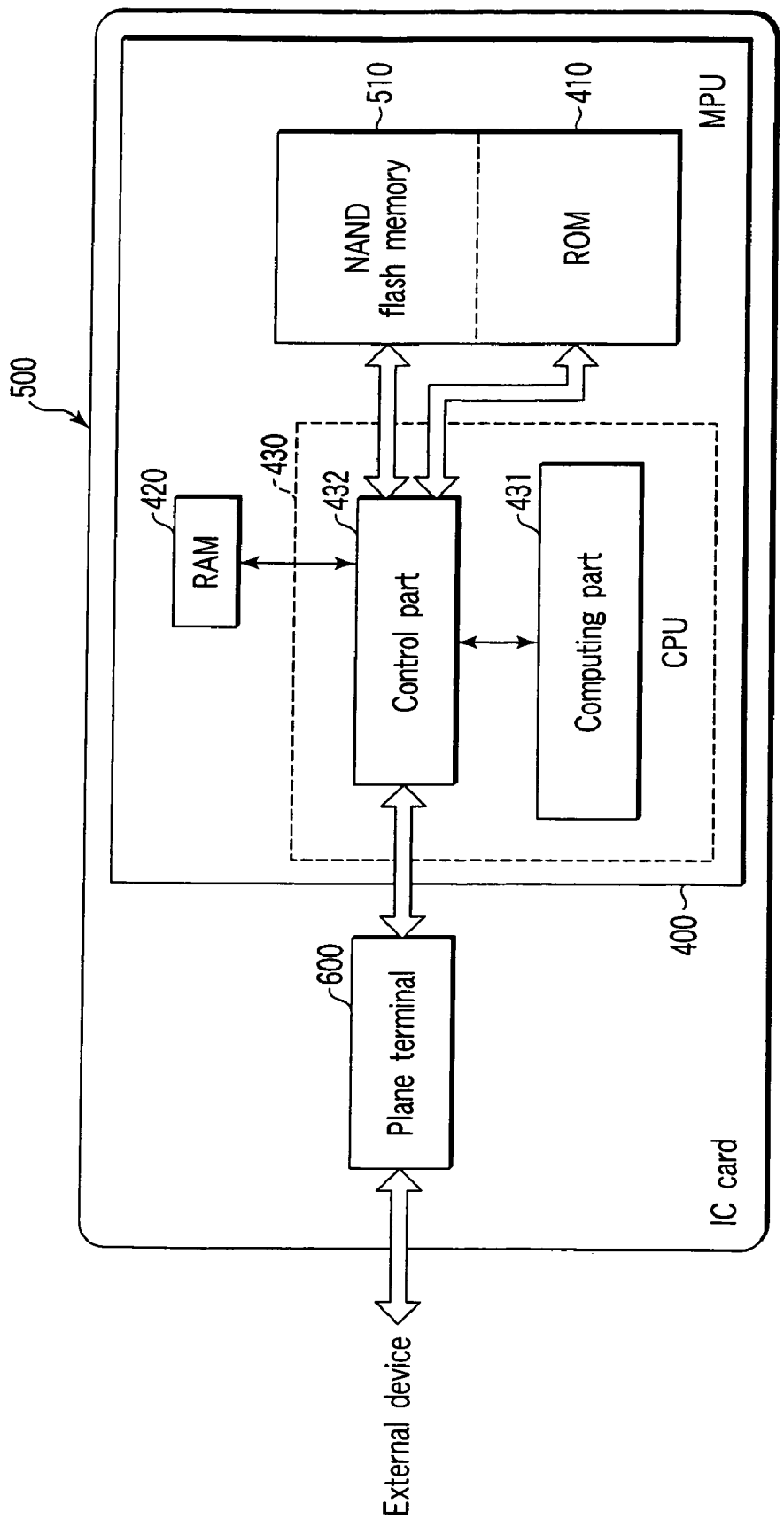

In a further example of the IC card 500, as shown in FIG. 49, the ROM 410 is contained therein instead of the semiconductor memory device 250 shown in FIG. 46, whereby a flash memory 510 which can operate in the EEPROM mode having a ROM region is formed as a whole. This application resembles the FIG. 46 application in that the flash memory 510 is contained in the MPU 400.

Other Embodiments

While the present invention is described using the first to tenth embodiments heretofore, it should be understood that the invention is not limited to the descriptions and the drawings disclosed herein. Those skilled in the art will understand various modified embodiments and techniques from the disclosure.

The stack gate structure is used for the basic element structure of the memory cell transistors in the semiconductor memory devices of the first to tenth embodiments. The sidewall control gate structure or the MONOS structure may be used in place of the stack gate structure. The fabrication process may also be variously modified and altered.

Further, the memory cell transistors in the semiconductor memory devices of the first to tenth embodiments are not limited to the two-value logic memory, but may be applied to the multi-value logic memory, i.e., three-value or higher-value logic memory. For example, the nonvolatile semiconductor memory device which stores four-value can realize twice as much memory capacity as the semiconductor memory device which stores two-value. The same rules are applied to the nonvolatile semiconductor memory device which stores multi-value such as an m-value logic memory (m>3).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate;
   active regions formed on a surface of the semiconductor substrate, separated from one another by element separating regions and extending in a first direction;
   a first word line and a second word line both extending in a second direction crossing the first direction;
   a pair of first select gate lines extending in the second direction between the first word line and the second word line;
   memory cell transistors each provided at each of intersections of the first and second word lines and the active regions on the surface of the semiconductor substrate;
   first select gate transistors each provided at each of intersections of the pair of first select gate lines and the active regions on the surface of the semiconductor substrate; and
   a first contact provided between the pair of first select gate lines and contacting adjacent two of the active regions.

2. The device according to claim 1, further comprising:
   a pair of second select gate lines extending in the second direction on a side of the first word line, which is opposite to the pair of the first selected gate lines;
   second select gate transistors each provided at each of intersections of the pair of second select gate lines and the active regions on the surface of the semiconductor substrate; and
   a second contact contacting one of the active regions between the pair of second select gate lines.

3. The device according to claim 2, wherein a length in the second direction of the second contact is equal to a length in the second direction of the one of the active regions which contacts the second contacts.

4. The device according to claim 1, wherein the first contact contacts adjacent three of the active regions.

5. The device according to claim 1, wherein the first contact contacts adjacent four of the active regions.

6. The device according to claim 1, wherein each of the memory cell transistors comprises:
   a first insulating film provided on the semiconductor substrate;
   a first gate electrode provided on the first insulating film;
   a second insulating film provided on the first gate electrode;
   a second gate electrode provided on the second insulating film; and
   source/drain regions formed in the surface of the semiconductor substrate and sandwiching a channel region under the first gate electrode.

7. The device according to claim 1, wherein the first contact contacts sequentially adjacent two of the active regions.

8. The device according to claim 1, wherein the first contact contacts both adjacent two of the active regions.

9. A nonvolatile semiconductor memory device comprising:
   a semiconductor substrate;
   active regions formed on a surface of the semiconductor substrate, separated from one another by element separating regions and extending in a first direction;
   word lines extending in a second direction crossing the first direction;
   a pair of first select gate lines provided between a first pair of the word lines and extending in the second direction;
   a pair of second select gate lines provided between a second pair of the word lines and extending in the second direction;
   memory cell transistors each provided at each of intersections of the active regions and the word lines on the surface of the semiconductor substrate;
   select gate transistors each provided at each of intersections of the active regions and the first select gate lines and intersections of the active regions and the second select gate lines on the surface of the semiconductor substrate;
   a first contact contacting adjacent two of the active regions between the pair of first select gate lines; and
   a second contact contacting one of the active regions between the pair of second select gate lines.

10. The device according to claim 9, wherein a length in the second direction of the second contact is equal to a length in the second direction of the one of the active regions which contacts the second contacts.

11. The device according to claim 9, wherein the first contact contacts adjacent three of the active regions.

12. The device according to claim 9, wherein the first contact contacts adjacent four of the active regions.

13. The device according to claim 9, wherein each of the memory cell transistors comprises:
   a first insulating film provided on the semiconductor substrate;
   a first gate electrode provided on the first insulating film;
   a second insulating film provided on the first gate electrode;
   a second gate electrode provided on the second insulating film; and
   source/drain regions formed in the surface of the semiconductor substrate and sandwiching a channel region under the first gate electrode.

14. The device according to claim 9, wherein the first contact contacts sequentially adjacent two of the active regions.

15. The device according to claim 9, wherein the first contact contacts both adjacent two of the active regions.

* * * * *